(12) United States Patent
Carman et al.

(10) Patent No.: US 12,073,870 B2
(45) Date of Patent: Aug. 27, 2024

(54) SENSE AMPLIFIER WITH DIGIT LINE MULTIPLEXING

(71) Applicant: Micron Technology, Inc., Boise, ID (US)

(72) Inventors: Eric Carman, San Francisco, CA (US); Daniele Vimercati, El Dorado Hills, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 18/217,205

(22) Filed: Jun. 30, 2023

(65) Prior Publication Data

US 2023/0352080 A1    Nov. 2, 2023

Related U.S. Application Data

(62) Division of application No. 17/369,873, filed on Jul. 7, 2021, now Pat. No. 11,727,981.

(51) Int. Cl.
| | |
|---|---|
| *G11C 7/06* | (2006.01) |
| *G11C 11/4074* | (2006.01) |
| *G11C 11/4091* | (2006.01) |
| *G11C 11/4094* | (2006.01) |
| *G11C 11/4096* | (2006.01) |
| *G11C 11/4099* | (2006.01) |

(52) U.S. Cl.
CPC .......... *G11C 11/4091* (2013.01); *G11C 7/065* (2013.01); *G11C 11/4074* (2013.01); *G11C 11/4094* (2013.01); *G11C 11/4096* (2013.01); *G11C 11/4099* (2013.01)

(58) Field of Classification Search
CPC . G11C 11/4091; G11C 7/065; G11C 11/4074; G11C 11/4094; G11C 11/4096; G11C 11/4099
See application file for complete search history.

(56) References Cited

U.S. PATENT DOCUMENTS

| | | |
|---|---|---|
| 10,388,361 B1 | 8/2019 | Vimercati et al. |
| 10,546,629 B1 | 1/2020 | Vimercati |
| (Continued) | | |

OTHER PUBLICATIONS

"International Search Report and Written Opinion of the International Searching Authority," issued in connection with Int'l Appl. No. PCT/US2022/073063 dated Oct. 14, 2022 (9 pages).

*Primary Examiner* — Mushfique Siddique
(74) *Attorney, Agent, or Firm* — Holland & Hart LLP

(57) ABSTRACT

Methods, systems, and devices for sense amplifier with digit line multiplexing are described. A method includes precharging an input and an output of an amplifier stage of a sense component to a first voltage based on a read operation associated with a memory cell. The method includes precharging a first side and a second side of a latch stage of the sense component to the first voltage based on precharging the output of the amplifier stage to the first voltage, the latch stage coupled with the amplifier stage. The method may also include coupling a second voltage from a digit line associated with the memory cell to the input of the amplifier stage, the amplifier stage generating a third voltage on the output based on coupling the second voltage to the input, and the latch stage latching a logic value associated with the memory cell based on the third voltage.

17 Claims, 13 Drawing Sheets

(56) References Cited

U.S. PATENT DOCUMENTS

| | | |
|---|---|---|
| 2006/0268638 A1 | 11/2006 | Yoon et al. |
| 2011/0090745 A1* | 4/2011 | La Rosa ................ G11C 16/28 |
| | | 327/51 |
| 2015/0155014 A1 | 6/2015 | Giridhar et al. |
| 2016/0125939 A1* | 5/2016 | Park .................... G11C 11/5678 |
| | | 365/148 |
| 2019/0333563 A1 | 10/2019 | Di Vincenzo |
| 2020/0075076 A1* | 3/2020 | Lee .................... G11C 11/4091 |
| 2020/0202907 A1* | 6/2020 | Yudanov ............... G11C 11/221 |
| 2020/0335152 A1* | 10/2020 | Vimercati ........... G11C 11/2275 |

\* cited by examiner

SENSE AMPLIFIER WITH DIGIT LINE MULTIPLEXING

CROSS REFERENCE

The present Application for Patent is a divisional of U.S. patent application Ser. No. 17/369,873 by Carman et al., entitled "SENSE AMPLIFIER WITH DIGIT LINE MULTIPLEXING," filed Jul. 7, 2021, assigned to the assignee hereof, and is expressly incorporated by reference in its entirety herein.

FIELD OF TECHNOLOGY

The following relates generally to one or more systems for memory and more specifically to sense amplifier with digit line multiplexing.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
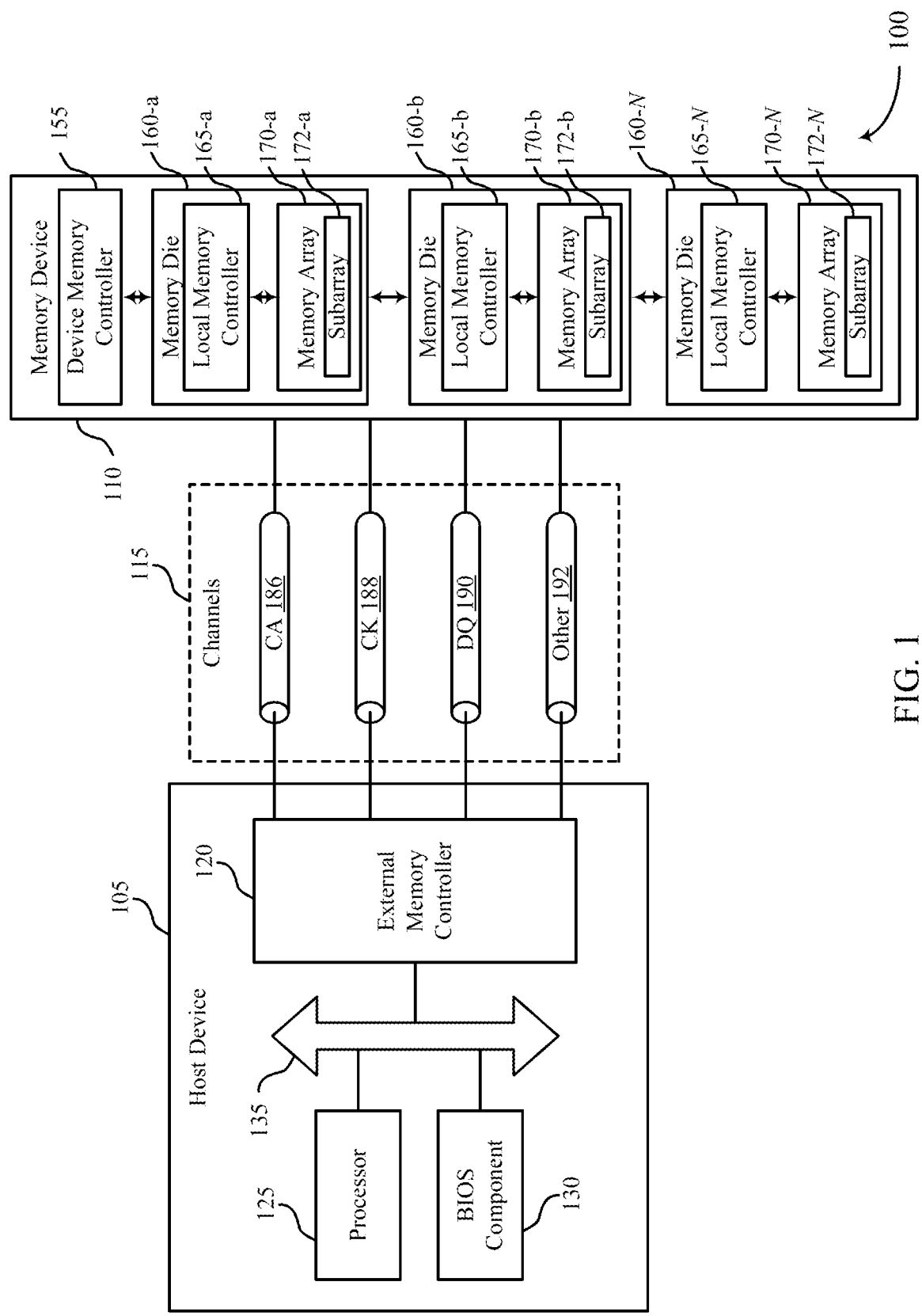
FIG. 1 illustrates an example of a system that supports sense amplifier with digit line multiplexing in accordance with examples as disclosed herein.

A memory device may include a memory array to store data. The memory device may be or may include a memory die. In some examples, the memory device may receive access commands (e.g., read, write, refresh commands) from a host device. In such examples, the memory device may utilize a sense component (e.g., sense amplifier). For example, a sense component may be used to read a logic state of a memory cell in the memory array. In some examples, the sense component may utilize a substantial amount of area in the memory die. This may be especially prevalent when the memory device includes a plurality of subarrays (e.g., tiles, subtiles) in the memory array and each subarray includes a sense component.

Systems, techniques, and devices are described herein for improved sensing techniques and sensing architectures that may reduce an amount of area utilized by sense amplifiers and sense components in a memory device. For example, the memory device may equalize a voltage across an amplifier stage of the sense component and a latch stage of the sense component before enabling the sense component. In such examples, the equalization may provide enhanced read margin.

In other examples, the memory device may utilize subarrays (e.g., tiles, subtiles) that comprise single transistor amplifiers to read memory cells on local digit lines—e.g., digit lines coupled directly with the memory cells) In such examples, the single transistors may amplify a charge received from the memory cell onto a global digit line (e.g., digit lines coupled directly with a second sense amplifier), where the second sense amplifier may be able to latch a logic state received from the global digit line. This may increase the read margin and reduce an amount of area used by the sense amplifiers, which may allow for larger memory arrays to be utilized.

Additionally or alternatively, the memory device may use a second digit line (e.g., a digit line in addition to a first digit line coupled with a memory cell) in a switch cap sense amplifier architecture. In such examples, the first digit line coupled with the memory cell may transfer a charge from the memory cell to an input node of a sense amplifier and then a reference charge from the second digit line may be transferred to the input node. The second digit line may be a digit line from a memory array that is not in use (e.g., an untargeted neighboring memory array) or the second digit line may be a dummy digit line. In either example, an intrinsic capacitance of the second digit line may be used in lieu of discrete capacitors for the switch cap sense amplifier architecture.

Features of the disclosure are initially described in the context of systems and dies as described with reference to FIGS. 1 and 2. Features of the disclosure are described in the context of memory dies, timing diagrams, subarrays, and sense architectures as described with reference to FIGS. 3-9 These and other features of the disclosure are further illustrated by and described with reference to an apparatus diagram and flowcharts that relate to sense amplifier with digit line multiplexing as described with reference to FIGS. 10-13.

FIG. 1 illustrates an example of a system 100 that supports sense amplifier with digit line multiplexing in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160 a, memory die 160 b, memory die 160 N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the memory device 110 may precharge an input stage and an output stage of a sense amplifier and at least one of a first side and a second side of a latch to equalize a voltage across each of the nodes before enabling the sense amplifier for an access operation. In such examples, the memory device 110 may enhance a read margin.

The memory device 110 may also include a plurality of subarrays 172 in each memory array 170. In such examples, each subarray 172 may include a single transistor amplifier that reads a charge associated with a memory cell from a local digit line and output the charge to a global digit line coupled with a second sense amplifier. This may enhance the read margin and reduce an amount of area used by the sense amplifiers.

The memory device 110 may also use a switch cap sense amplifier architecture with a first digit line coupled with a memory cell and a second digit line that is either a dummy digit line or a digit line from an unselected portion of the memory array 170. A charge associated with the memory cell may be transferred to an input node of the sense amplifier via the first digit line and a second charge (e.g., from a reference voltage on the second digit line) may be transferred from the second digit line to the input node. In such switch cap sense amplifier architectures, the memory device 110 may utilize the intrinsic capacitance of the first digit line and the second digit line instead of discrete capacitors for the switch cap sense amplifier architecture.

Figure 2:
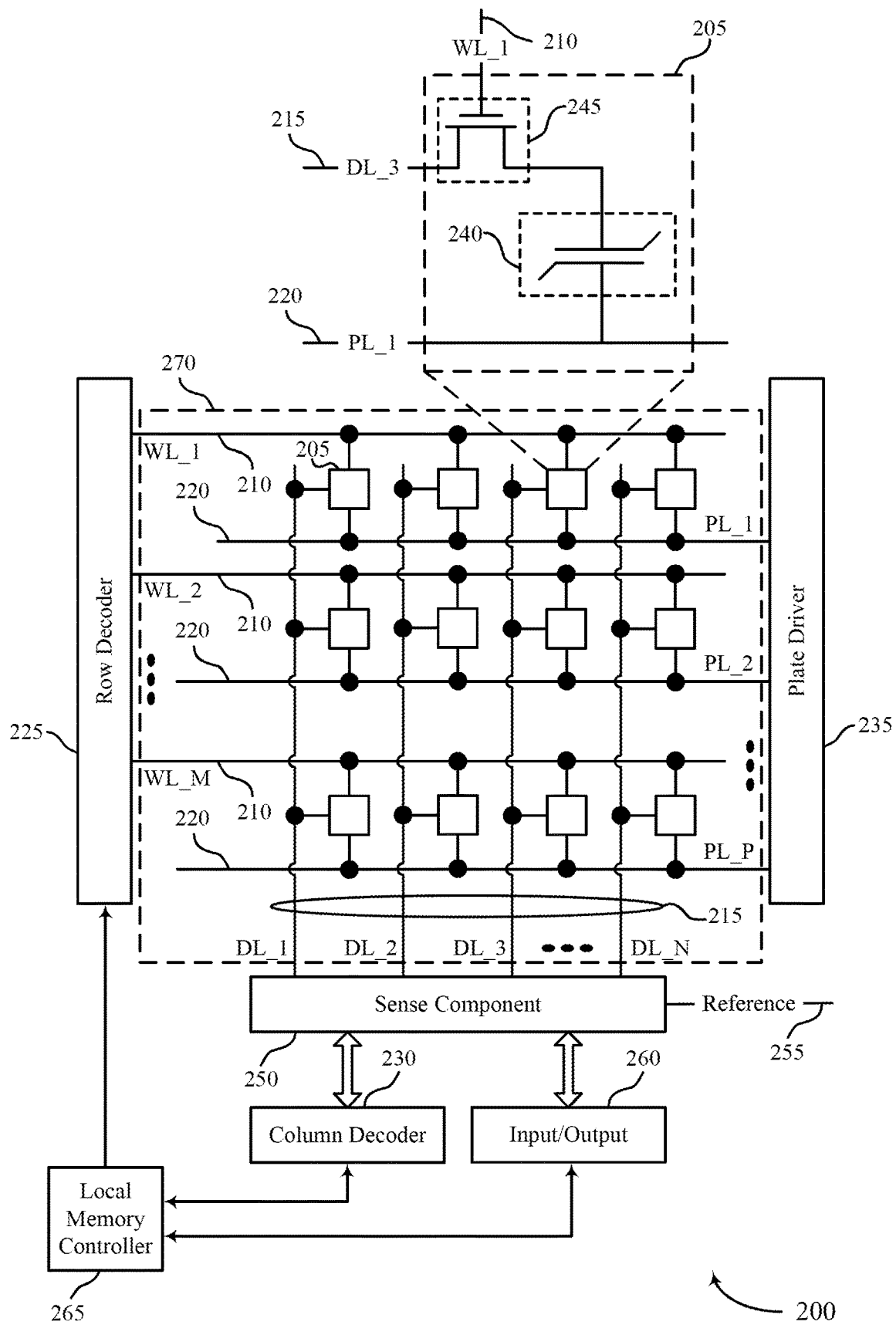
FIG. 2 illustrates an example of a memory die that supports sense amplifier with digit line multiplexing in accordance with examples as disclosed herein.

FIG. 2 illustrates an example of a memory die 200 that supports sense amplifier with digit line multiplexing in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components. The memory cells 205 may be examples of DRAM memory cells or other memory cells.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be operable to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be operable to selectively couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may cooperate with the digit line 215 to bias the capacitor 240 during access operation of the memory cell 205.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device 110 that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired logic state. The local memory controller 265 may identify a target memory cell 205 on which to perform the write operation. The local memory controller 265 may identify a target word line 210, a target digit line 215, and a target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The local memory controller 265 may apply a specific signal (e.g., write pulse) to the digit line 215 during the write operation to store a specific state (e.g., charge) in the capacitor 240 of the memory cell 205. The pulse used as part of the write operation may include one or more voltage levels over a duration.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to the reference 255. Based on that comparison, the sense component 250 may determine a logic state that is stored on the memory cell 205.

In some examples, local controller 265 may precharge an input stage and an output stage of a sense amplifier of the sense component 250 to a same voltage as at least one of a first side and a second side of a latch stage of the sense component 250 before enabling the sense component 250 for a read operation. In such examples, the sense component 250 read margin may be enhanced.

In other examples, the memory cells 205 illustrated in memory die 200 may be associated with a subarray 270 of a plurality of subarrays 270 in the memory die 200. In such examples, the sense component 250 may be a single transistor amplifier that receives a charge associated with the memory cells 205 from local digit lines 215. The sense component 250 may amplify and output the charge to global digit lines (not illustrated). The global digit lines may be coupled with a second sense component configured to latch a logic value associated with the charge from the memory cells 205. Utilizing single transistor amplifiers for each subarray 270 and a second sense component for a plurality of subarrays 270 may reduce an amount of size used by the sense components 250.

Figure 3:
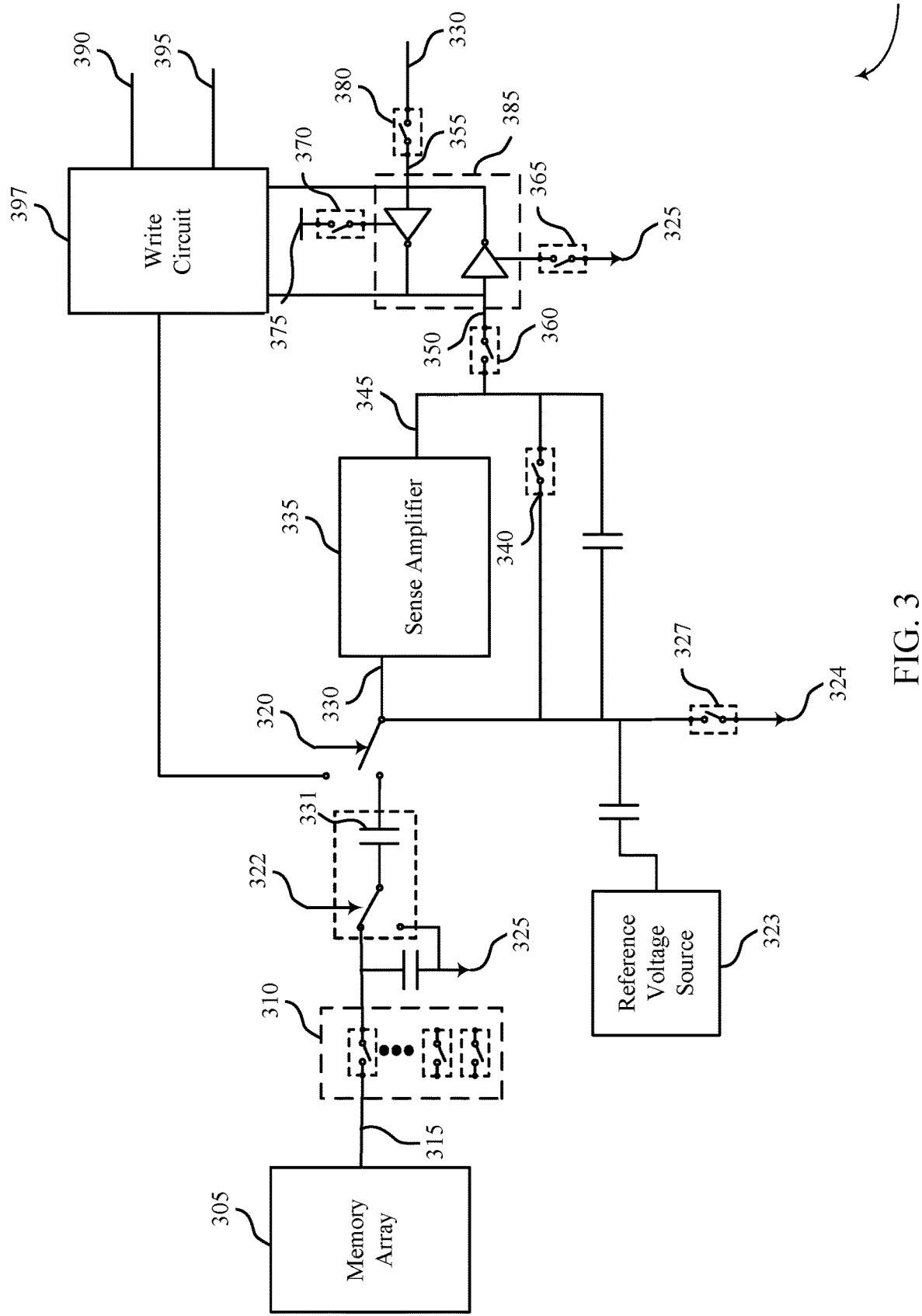
FIG. 3 illustrates an example of a memory die that supports sense amplifier with digit line multiplexing in accordance with examples as disclosed herein.

In other cases, the memory die 200 may use a switch cap sense amplifier architecture with a first digit line 215 coupled with a memory cell 205 and a second digit line 215 (not illustrated) that is either a dummy digit line or a digit line from an unselected portion of the memory array 170 coupled with the reference 255. A charge associated with the memory cell 205 may be transferred to the sense component 250 via the first digit line 215 and a reference 255 may be transferred from the second digit line 215 to the input node. In such switch cap sense amplifier architectures, the memory die 200 may utilize the intrinsic capacitance of the first digit line 215 and the second digit line 215 instead of discrete capacitors for the switch cap sense amplifier architecture FIG. 3 illustrates an example of a memory die 300 that supports sense amplifier with digit line multiplexing in accordance with examples as disclosed herein. Memory die 300 may be an example of memory die 200 as described with reference to FIG. 2. Memory die 300 includes examples of components as described with reference to FIGS. 1 and 2. For example, memory die 300 may include a memory array 305, a digit line 315, a reference voltage source 323, and a sense amplifier 335 (e.g., an amplifier stage) and latch 385 (e.g., a latch stage) which may collectively be referred to as a sense component. These components may be examples of memory array 170, digit line 215, reference 255, and sense component 250 as described with reference to FIG. 2. The memory die 300 may include a write circuit 397.

In some examples, memory array 305 may comprise one or more memory cells configured to store data. In some examples, the one or more memory cells may be selected for an access operation (e.g., a read operation). In such an example, a charge or voltage associated with the memory cell may be transferred to digit line 315. Digit line 315 may be configured to couple with sense amplifier input 330 based on switch 310 being active and switch 320 coupling to the sense amplifier 335 path. In some examples, switch 310 may be an example of a digit line selection switch or shunt. That is, switch 310 may couple a selected digit line 315 coupled with memory array 305 to the sense amplifier 335 or latch 385. In some examples, an input of switch 320 may be coupled directly with digit line 315—e.g., when sense amplifier 335 is a differential amplifier. In other examples, a capacitor may be coupled between digit line 315 and the input of switch 320—e.g., when sense amplifier 335 is a single transistor amplifier.

Reference voltage source 323 may be configured to supply a reference voltage to sense amplifier 335 during an access operation—e.g., during a read operation. In some examples, reference voltage source 323 may include a switch (not illustrated) that couples sense amplifier input 330 with a reference voltage or a ground voltage for (e.g., or during) various access operations that may be performed.

Sense amplifier 335 is configured to amplify a charge received from digit line 315 to latch 385. In some examples, the sense amplifier 335 may be a single transistor amplifier. In such examples, the sense amplifier 335 may be self-referencing. That is, sense amplifier 335 may operate at a bias point that corresponds to an inherent sense voltage (e.g., voltage threshold) of the single transistor. For example, sense amplifier 335 may receive a charge from digit line 315 and then a charge from reference voltage source 323 to generate a voltage indicative of a logic state of a memory cell coupled with digit line 315. In other examples, sense amplifier 335 may be a differential amplifier. In such examples, sense amplifier 335 may be coupled with the first input 330 and a reference voltage via a second input (not illustrated), and may generate a voltage indicative of the logic state of the memory cell based on a difference between the second input and first input 330.

Latch 385 may be configured to store a logic state associated with a memory cell based on receiving an output 345 from the sense amplifier 335. Latch 385 may be coupled with write circuit 397. In some examples, write circuit 397 may perform a write operation based on receiving a write bit signal 395 or level shift a logic value from latch 385 to a voltage used to write the memory cell. The write circuit 397 may be configured to receive a flip-bit signal 390.

In some examples, before the access operation is performed, memory array 305 may precharge an input 330 and output 345 of sense amplifier 335 to a same voltage as a first side 350 of a latch 385—e.g., equalizing across the input 330 and the output 345 of the sense amplifier 335 and the first side 350 of the latch 385. In such examples, switch 327 may be configured to be deactivated to decouple input 330 from a reference voltage 324 (e.g., ground voltage). Memory die 300 may activate switches 340 and 360 to equalize across sense amplifier 335 and first side 350 of latch 385. That is, switch 340 may couple input 330 with output 345 of sense amplifier 335 and switch 360 may couple output 345 of sense amplifier 335 with first side 350 of latch 385. In some examples, switch 380 may be deactivated and cause node 355 to be in a floating state. Additionally, switches 310, 365 and 370 may be deactivated while precharging the sense amplifier 335 and latch 385 and cause the cross-coupled inverters of latch 385 to be deactivated. Precharging input 330 and the output 345 of the sense amplifier 335 and first side 350 of latch 385 to the same voltage may enhance a read margin.

After the precharge operation, switches 340 and 360 may be deactivated to isolate input 330 and output 345 of sense amplifier 335 from first side 350 of latch 385 and from each other. The memory die 300 may also deactivate a switch coupling sense amplifier 335 to a precharge voltage. The memory die 300 may then activate switch 310 and switch 320 to couple digit line 315 with input 330 of the sense amplifier 335—e.g., in some cases switch 320 may directly couple digit line 315 with input 330. In such examples, a voltage of digit line 315 may be coupled with input 330 of the sense amplifier. If sense amplifier 335 is a differential amplifier, the memory die 300 may then couple a reference voltage to the second input of sense amplifier 335 (not shown) and sense amplifier 335 may generate a voltage at the output 345 according to a difference between the inputs. If sense amplifier 335 is a single transistor amplifier, there may be a capacitor 331 coupled between digit line 315 and input 330. In such examples, input 330 may be precharged to a threshold voltage of the single transistor. A first side of capacitor 331 may be coupled with input 330, a second side of capacitor 331 may be switched between a reference node (e.g., ground voltage 325) and digit line 315 using switch 322. When switch 322 initially couples the second side of the capacitor to the reference voltage and switches to digit line 315, the voltage on digit line 315 couples to input 330 via capacitor 331. In such examples, memory die 300 may then couple a reference voltage from reference voltage source 323 to the first side of the capacitor causing a change in the first voltage at the first side of the capacitor and a difference between the first voltage and reference voltage (e.g., second voltage) couples to input 330 of sense amplifier 335. Sense amplifier 335 may generate a voltage at output 345 based on the voltage of digit line 315 coupled to input 330 and receiving a difference between the first voltage and the second voltage. For example, sense amplifier 335 may generate a third voltage at output 345 if the voltage of digit line 315 is greater than the difference between the first voltage and the second voltage and may output a fourth voltage if the voltage of digit line 315 is less than the difference between the first voltage and the second voltage. The memory die may then activate switches 365 and 370, which may latch a logic state associated with the memory cell based on receiving the third voltage or the fourth voltage. For example, activating switch 370 may couple a supply voltage 375 for the latch. After latch 385 latches the logic state, switch 360 may be deactivated and switch 380 may be activated to couple second side 355 with input 330—which may feedback a voltage of latch 385 to digit line 315.

Figure 4:
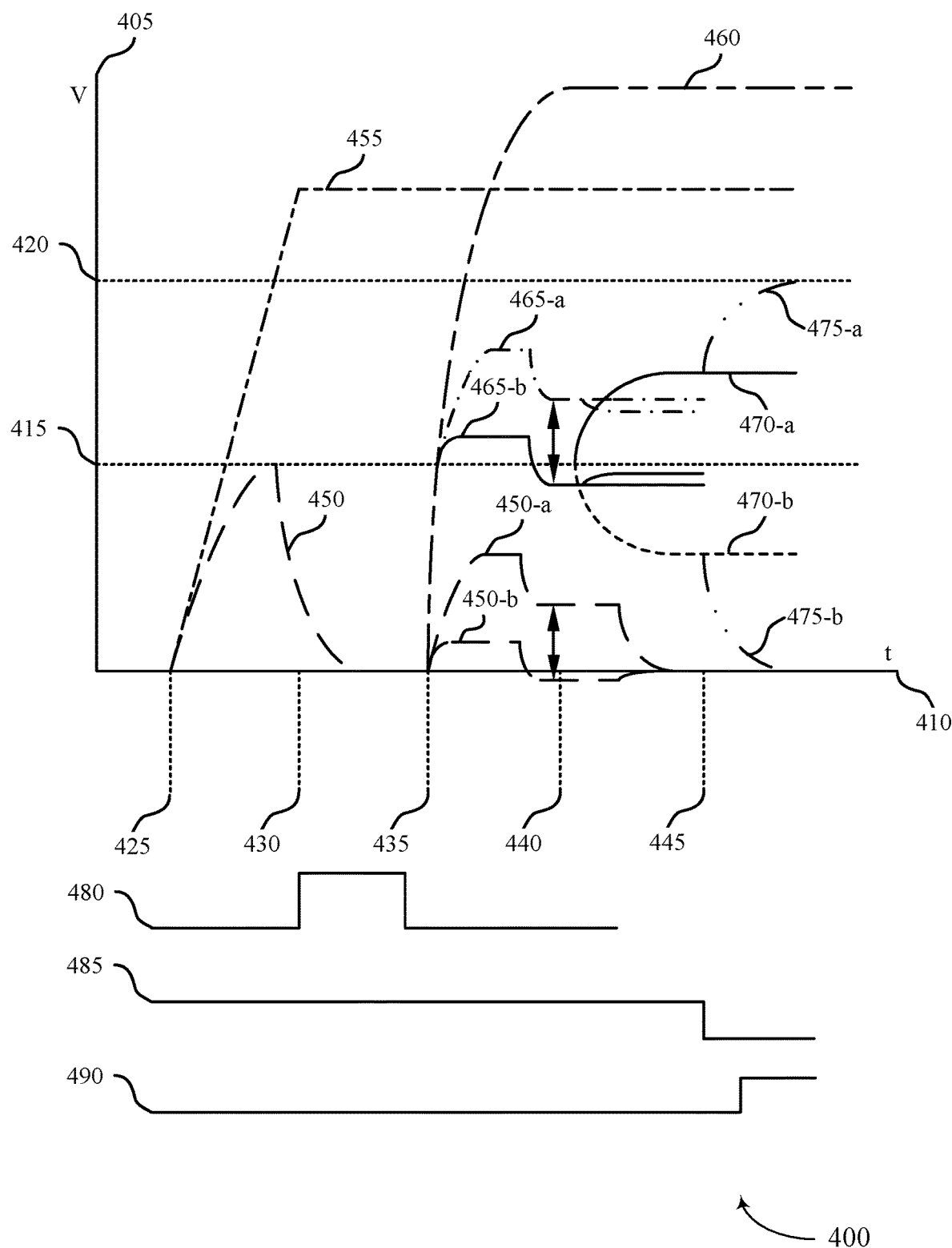
FIG. 4 illustrates an example of a timing diagram that supports sense amplifier with digit line multiplexing in accordance with examples as disclosed herein.

FIG. 4 illustrates an example of a timing diagram 400 that supports sense amplifier with digit line multiplexing in accordance with examples as disclosed herein. Timing diagram 400 includes a voltage axis 405 and a time axis 410 and may represent at least a portion of a read operation. The voltages of various components as a function of time are also represented on timing diagram 400. For example, timing diagram includes a word line voltage 460, a plate line voltage 455, a selected digit line voltage 450, an input voltage 465, a differential output voltage 470, and a latch output voltage 475. Voltage 415 may be a reference voltage at a second input of a sense amplifier as described with reference to FIG. 3. Voltage 420 may be a voltage (e.g., a supply voltage) coupled to the sense amplifier 335.

By way of example, word line voltage 460 may represent a voltage at a word line (e.g., word line 210 as described with reference to FIG. 2) coupled with a memory cell, a plate line voltage 455 may represent a voltage at a plate line (e.g., plate line 220 as described with reference to FIG. 2), and digit line voltage 450 may represent a voltage at a digit line (e.g., digit line 315 as described with reference to FIG. 3). Input voltage 465 may represent a voltage at an input stage (e.g., input 330 as described with reference to FIG. 3) of a sense amplifier and differential output voltage 470 may represent a voltage at an output stage (e.g., output 345) of the sense amplifier. Latch output voltage 475 may represent an output voltage at a latch (e.g., latch 385 as described with reference to FIG. 3). Timing diagram 400 may also illustrate a precharge signal 480, an isolation signal 485, and a sense amplifier fire signal 490. Timing diagram 400 may result from operating memory die 300 as described with reference to FIG. 3, and the following discussion is in the context of components depicted in FIG. 3.

At 425, plate line voltage 455 may be driven to a plate line coupled with a memory cell. In some examples, the increase in plate line voltage 455 may cause an unselected digit line voltage to increase at the same rate—e.g., an unselected digit line voltage may be the same as plate line voltage 455. A selected digit line voltage 450 may also spike.

At 430, precharge signal 480 may go high. In some examples, precharge signal 480 going high may couple the input and output of the sense amplifier with the first side of the latch and precharge them to the same voltage. The selected digit line voltage 450 may also decrease and be precharged to ground between 430 and 435.

At 435, word line voltage 460 may be driven to a word line coupled with a memory cell to activate the memory cell. In some examples, increasing word line voltage 460 may cause the memory cell to transfer charge to the selected digit line—e.g., selected digit line voltage 450 may increase based on word line voltage 460 activating the memory cell. The memory cell sharing charge with the selected digit line may also cause input voltage 465 of the sense amplifier to increase.

At 440, memory die 200 may transition from a developing a signal on the selected digit line which is coupled to the sense amplifier input, to applying a reference charge to the sense amplifier input, and then sensing the resulting signal at the sense amplifier input. In such examples, memory die 200 may couple a reference charge to the second input of the sense amplifier and adjust the signal received at the sense amplifier from the selected digit line—e.g., the second input may be supplied with a capacitively coupled reference voltage and isolated from the first input. Coupling the reference voltage to the second input may allow detection of sense amplifier inputs above and below the precharge input level to the sense amplifier for a first logic state and a second logic state—e.g., a voltage difference between input voltage 465-a and 465-b and a voltage difference between selected digit line voltage 450-a and 450-b may be shifted to optimize the gain of the sense amplifier. In some examples, based on activating a different state, differential output voltage 470 may change—e.g., based on comparing the voltage on the first input with the voltage (e.g., reference voltage) on the second input.

At 445, isolation signal 485 goes low and differential output voltage 470 is isolated from the latch. In some examples, switches 370 and 365 may be active and supply a voltage to the latch. In such examples, the latch is coupled with the output of the sense amplifier until differential voltage 470 is latched. In such examples, isolation signal 485 goes low to isolate the sense amplifier output from the latch. Accordingly, latch output voltage 475 may increase if a first logic state is stored by the memory cell (e.g., latch output 475-a may increase) or the latch output voltage 475 may decrease if a second logic state is stored by the memory cell (e.g., latch output 475-b may decrease). After 445, sense amplifier fire signal 490 may go high and data may be read out from the sense component—read by a different component of the memory device to perform ECC operations or transmitting data to I/O pins.

Figure 5:
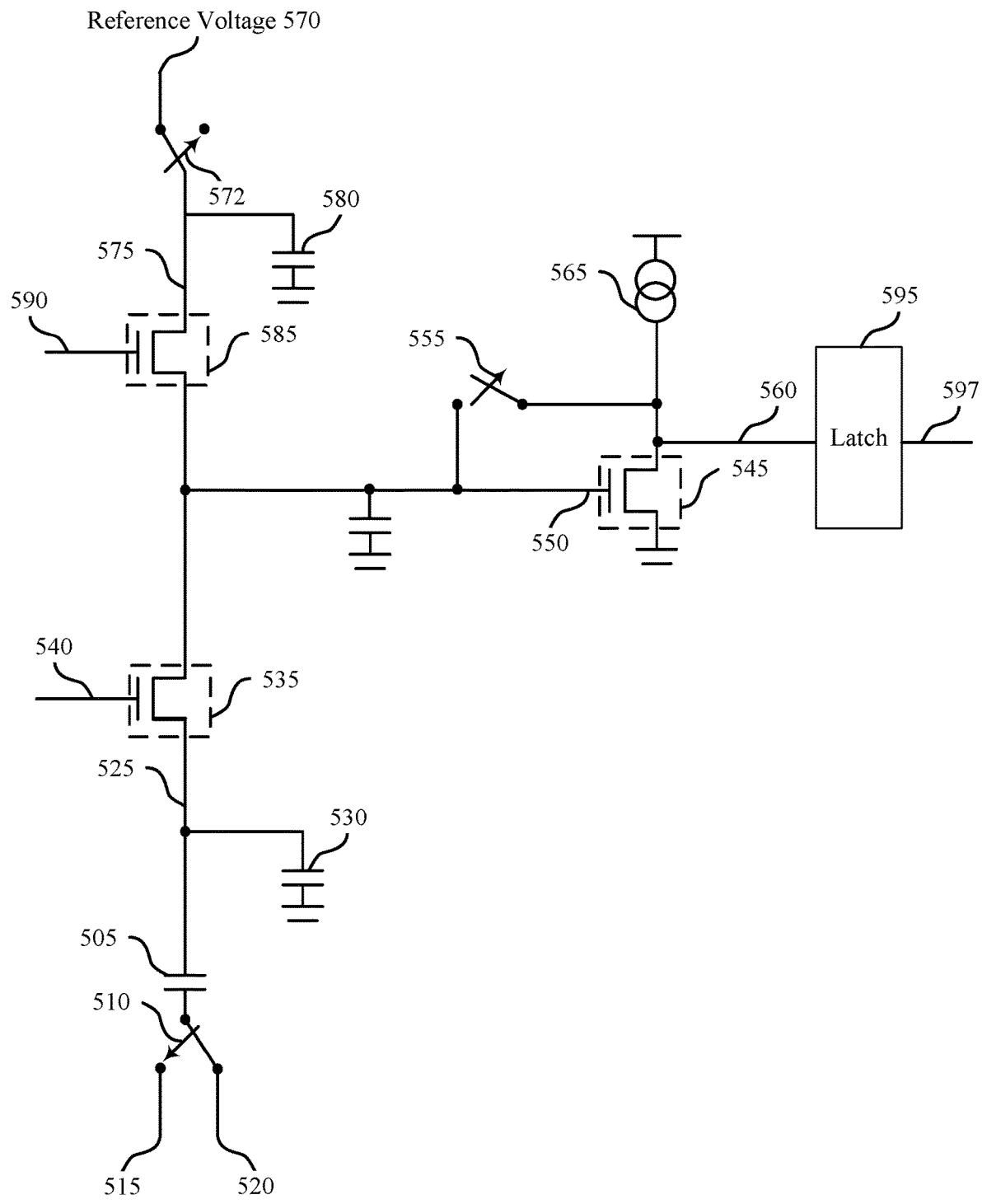
FIG. 5 illustrates an example of a memory die that supports sense amplifier with digit line multiplexing in accordance with examples as disclosed herein.

FIG. 5 illustrates an example of a memory die 500 that supports sense amplifier with digit line multiplexing in accordance with examples as disclosed herein. Memory die 500 may be an example of memory die 300 as described with reference to FIGS. 2 and 3. Memory die 500 includes examples of components as described with reference to FIGS. 2 and 3. For example, memory die 500 may include a memory cell 505, a first digit line 525, a second digit line 575, a reference voltage 570, a sense amplifier 545 (e.g., an amplifier stage) and a latch 595 (e.g., a latch stage) which may be examples of memory cell 205, digit line 215, reference 255, sense amplifier 335, and latch 385 as described with reference to FIGS. 2 and 3. Memory die 500 may also include switches 510, 555, 572, transistors 535 and 585, and a current mirror 565.

Memory cell 505 may be coupled with a first digit line 525 and configured to store a logic state—e.g., a charge or a voltage indicating the logic state. In some examples, memory cell 505 may also be coupled with switch 510. Switch 510 may be configured to couple the memory cell (e.g., a plate line side of the memory cell) to a voltage source 515 or a ground voltage 520 based on whether an access operation is performed. In some examples, the first digit line 525 may also have an intrinsic capacitance 530—e.g., capacitor 530 may not be a physical component but rather a symbolic representation of the intrinsic capacitance of the first digit line 525. In some examples, utilizing the intrinsic capacitance of first digit line 525 may conserve area in memory die 500 as additional physical components are not added.

First digit line 525 may be configured to transfer charge from the memory cell 505 to the gate 550 of the sense amplifier 545. In some examples, first digit line 525 may be coupled with a transistor 535. Transistor 535 may isolate the first digit line 525 from sense amplifier 545 or couple first digit line 525 with sense amplifier 545 based on a signal 540 and whether an access operation is being performed—e.g., transistor 535 may couple first digit line 525 with sense amplifier 545 based on receiving the signal 540.

A second digit line 575 may be coupled with a switch 572 and a transistor 585. In some examples, switch 572 may couple digit line 575 with reference voltage 570 based on whether an access operation is being performed. In some examples, second digit line 575 may have an intrinsic capacitance 580—e.g., capacitor 580 may not be a physical component but rather a symbolic representation of the intrinsic capacitance of the second digit line 575. In some examples, utilizing the intrinsic capacitance of second digit line 575 may conserve area in the memory die 500 as additional physical components are not added. In some examples, the second digit line 575 may be a dummy bit line. In other examples, second digit line 575 may be an unselected digit line 575 (e.g., untargeted digit line) from a portion of memory die 500 not associated with an access operation or an adjacent (e.g., neighboring) digit line 575. In either example, transistor 585 may couple the second digit line 575 (and the reference voltage 570) to the sense amplifier 545 based on a signal 590 and whether an access operation is being performed.

Sense amplifier 545 may be configured to amplify a charge received from the first digit line 525 and second digit line 575 and generate an output 560—e.g., at a drain 560 of the transistor. In some examples, sense amplifier 545 may be an example of a single transistor sense amplifier 545. In some examples, sense amplifier 545 may be precharged at gate 550 before an access operation occurs. In such examples, switch 555 may couple the gate 550 and drain 560 with a current mirror 565 to precharge the gate 550 and drain 560 to a first voltage. In some cases, the first voltage may be a threshold voltage of the sense amplifier 545 (e.g., of the single transistor gain stage of the sense amplifier 545). Current mirror 565 may also equalize a voltage at the gate 550, the drain or output 560 and at a latch 595—e.g., at a first side 560 and a second side 597 of latch 595.

Latch 595 may be configured to latch a logic state associated with a voltage received from the sense amplifier 545. In some examples, sense amplifier 545 may be coupled with a global digit line rather than a latch 595 as described with reference to FIGS. 7A and 7B.

Figure 6:
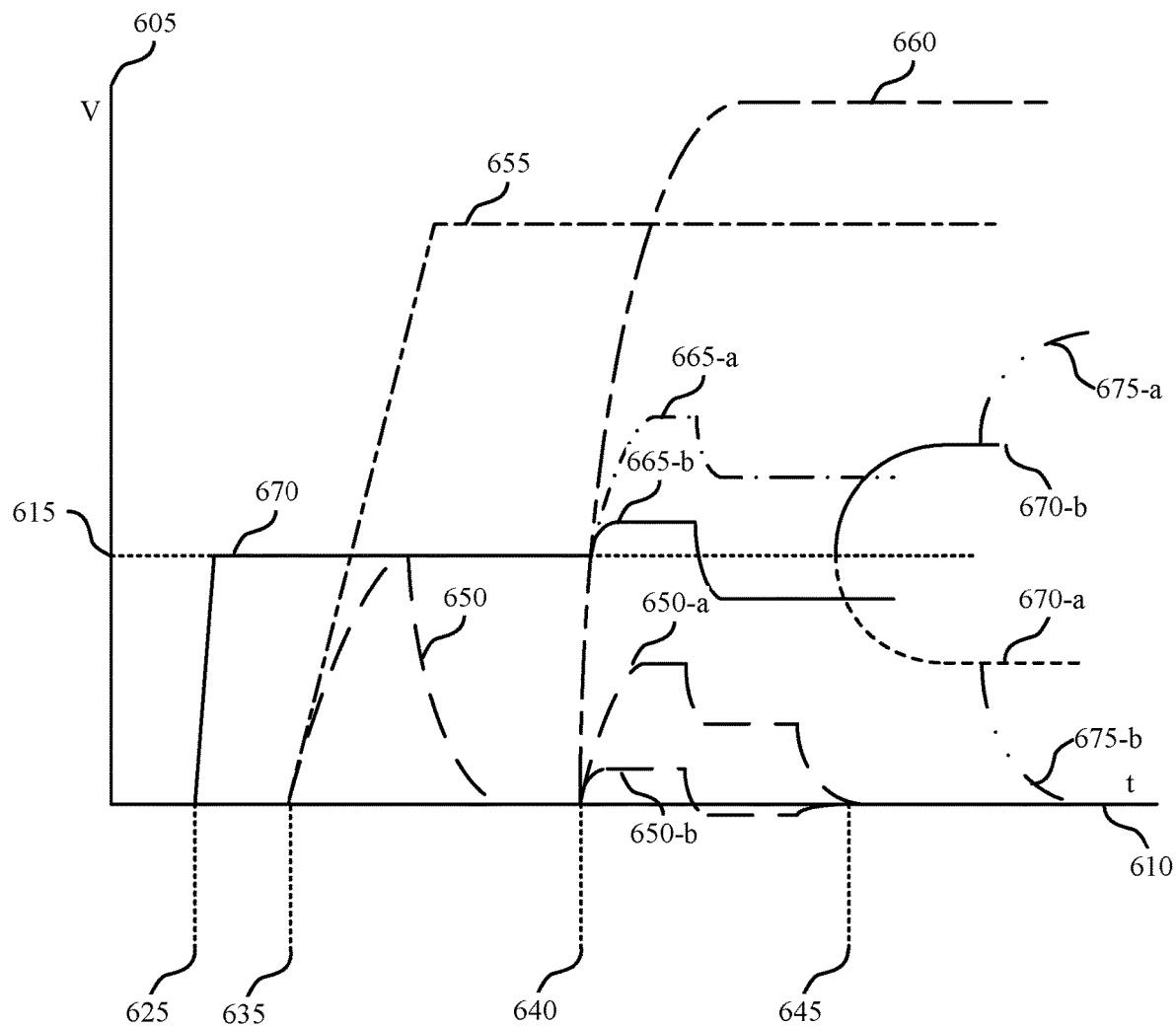
FIG. 6 illustrates an example of a timing diagram that supports sense amplifier with digit line multiplexing in accordance with examples as disclosed herein.

With reference to a timing diagram 600 illustrated in FIG. 6, an access operation at the memory die 500 is described. Timing diagram 400 includes a voltage axis 605 and a time axis 610 and may represent at least a portion of a read operation for the memory die 500 shown in FIG. 5. The memory die may precharge gate 550 of the sense amplifier 545 to a first voltage (e.g., at 625 to a voltage 615) by activating the switch 555. Activating the switch 555 may couple the gate 550 to the current mirror 565 in order to precharge the gate 550 to the first voltage. In such examples, voltage 670 may also represent a voltage at the output 560 of the sense amplifier and the first and second side of the latch—e.g., the voltage at the input and output of the sense amplifier may be equalized with at least one of the first side and second side of the latch as described with reference to FIG. 4.

After precharging sense amplifier 545 and before 635, memory die 500 may isolate the gate 550 of the sense amplifier 545 from the current mirror 565. In such examples, the switch 555 may be deactivated and the gate 550 may be isolated from the current mirror 565.

The switch 510 may be activated and couple a plate of the memory cell 505 with a voltage source 515 at 635—e.g., the switch 510 may be activated to switch from supplying a ground voltage 520 to the memory cell 505 to a voltage from the voltage source 515. In such examples, the plate line voltage 655 may increase based on the memory cell 505 being applied with the voltage from the voltage source 515. Additionally, first digit line voltage 650 may increase based on being coupled with the memory cell 505. In some examples, the memory die may precharge the first digit line 525 line to ground after the switch 510 is activated.

A word line (not illustrated) may be activated and couple the memory cell 505 with first digit line 525 at 640—e.g., a word line voltage 660 may be applied to the word line to select the memory cell 505. In such examples, memory cell 505 may share a charge or voltage with first digit line 525 associated with a logic state of the memory cell 505—e.g., a first digit line voltage 650-a or 650-b based on the logic state of the memory cell 505.

In some examples, while word line voltage 660 is applied, switch 572 may be activated and a reference voltage 570 may be applied to the second digit line 575. In some examples, switch 572 may be activated after the word line voltage 660 is applied. In some examples, applying and precharging second digit line 575 to reference voltage 570 is based on the intrinsic capacitance of the second digit line 575.

After coupling the memory cell 505 with the first digit line 525, the memory die 500 may activate transistor 535 based on a signal 540. In such examples, activating the transistor 535 may couple the first digit line 525 with the gate 550 of the sense amplifier 545. Accordingly, an input voltage 665 (e.g., a voltage at the gate 550) may increase by varying amounts from the reference voltage 615 based on the logic state of the memory cell—e.g., increase to input voltage 665-a or increase to input voltage 665-b based on a logic state of the memory cell.

After the charge is transferred from the first digit line 525 to the gate 550, the memory die 500 may activate transistor 585 based on a signal 590 to couple the second digit line 575 to the gate 550 of the sense amplifier 545—e.g., to apply the charge from the second digit line 575 to the gate 550. That is, first digit line 525 and second digit line 575 share a charge and a difference in voltage between the first digit line 525 and second digit line 575 may cause a voltage of the first digit line 525 (and gate 550) to decrease—e.g., causing shifts in input voltages 665-a and 665-b In some examples, the sense amplifier 545 may output a signal (e.g., output voltage 670) indicating a logic state of the memory cell 505 based on receiving the charge from the second digit line 575 at the reference voltage 570 and a difference in a voltage between the first digit line voltage 650 and the second digit line voltage. For example, sharing a charge between first digit line 525 and second digit line 575 causes voltages 665-a and 665-b to be either less than or greater than a threshold voltage of the sense amplifier 545. Accordingly, the gain stage of sense amplifier 545 may output different values for different states of the memory cell based on the voltage being less than or greater than the threshold voltage. For example, if the gate 550 is lower than the threshold voltage as shown by voltage 665-b, the current from current source 565 will cause the output 560 to go high at 645 (e.g., as shown by output voltage 670-b). Conversely, if the gate 550 is higher than the threshold voltage as shown by voltage 665-a, the transistor of amplifier 545 will pull the output 560 low at 645 (e.g., as shown by output voltage 670-a). In some examples, latch 595 may receive the output voltage 670 and latch a value (e.g., value 675-a for the case of output voltage 670-a and value 675-b for the case of output voltage 670-b) based on the output voltage 670 received at the first side 560 of the latch.

Utilizing the switch cap sense amplifier architecture compared with differential sense amplifiers may reduce a size of the memory array as an area utilized by the sense amplifiers may be reduced as discussed with reference to FIG. 7. Additionally, the memory array may be reduced by utilizing second digit line 575 rather than a discrete capacitor to store charge for memory cell 505 and the reference voltage.

Figure 7A:
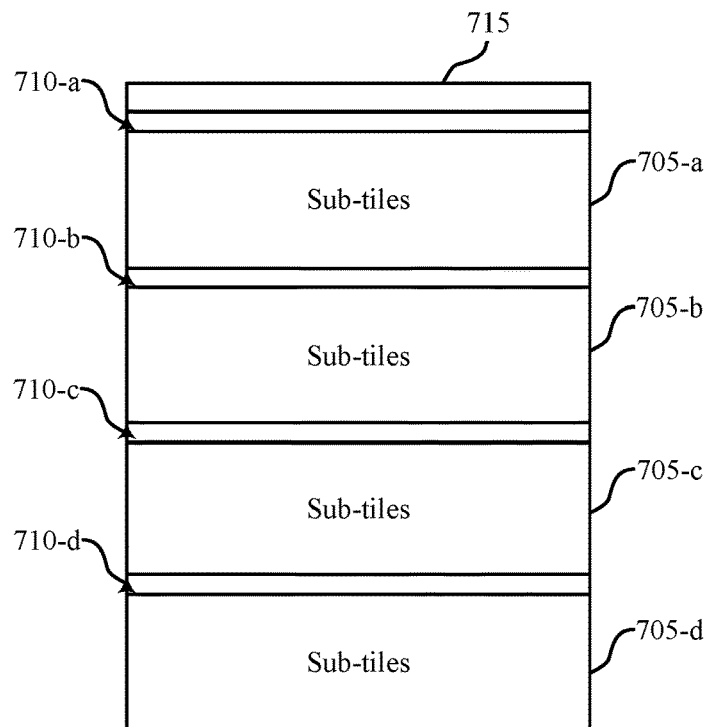
FIGS. 7A and 7B illustrates examples of a sense architecture that supports sense amplifier with digit line multiplexing in accordance with examples as disclosed herein.
Figure 7B:
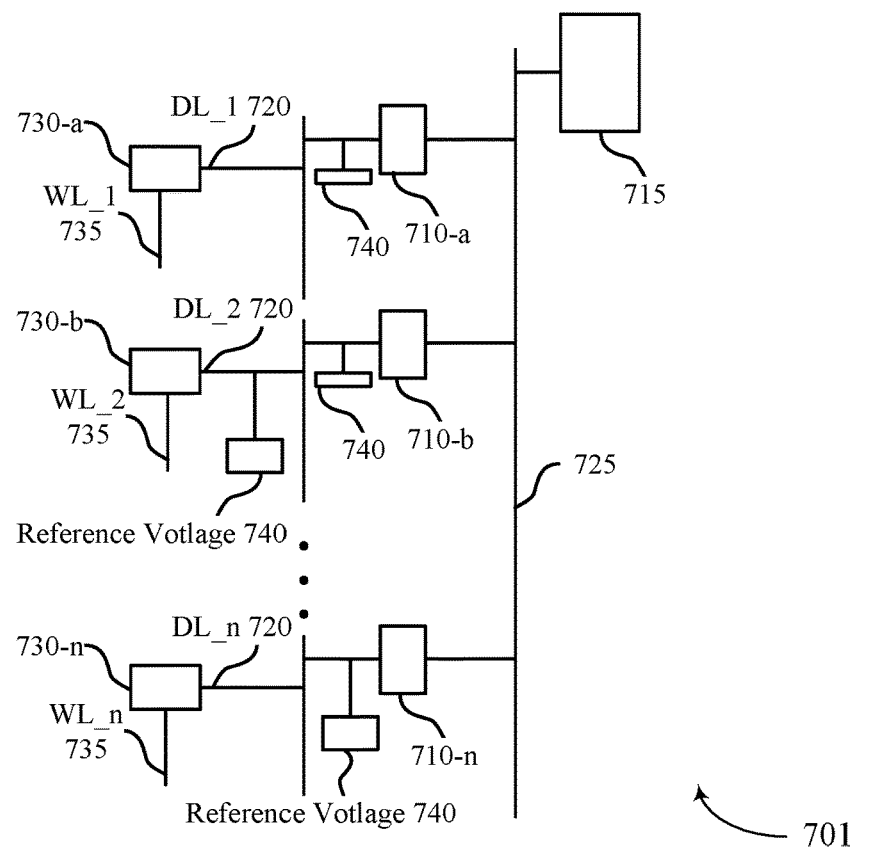

FIGS. 7A and 7B illustrate an example of a sense architecture 700 that supports sense amplifier with digit line multiplexing in accordance with examples as disclosed herein. The sense architecture 700 may include sub-tiles 705, amplifiers 710 (e.g., single transistor amplifiers or sense amplifier 545 as described with reference to FIG. 5), and a sense component 715. The sense architecture 701 may include digit lines 720 (e.g., first digit lines or digit lines 215 as described with reference to FIG. 2), global digit lines 725 (e.g., second digit lines), word lines 735 (e.g., word lines 210 as described with reference to FIG. 2), and memory cells 730 (e.g., memory cells 205 or 505 as described with reference to FIGS. 2 and 5).

In some examples, a memory array (e.g., memory array 170 or memory die) may include a plurality of sub-tiles 705. In some examples, each sub-tile 705 may include one or more memory cells 730 configured to store a logic state or bits of information. In some cases, each sub-tile 705 may also comprise a plurality of first digit lines 720 and an amplifier 710 coupled with each first digit line 720—e.g., first digit line (DL_1) 720 may be coupled with amplifier 710-a. First digit lines 720 may also be coupled with memory cells 730. In some examples, first digit lines 720 may be configured to transfer a charge or voltage from memory cell 730 to the amplifier 710—e.g., during a read operation as described with reference to FIGS. 4 and 5. In such examples, memory cell 730 may transfer charge to the first digit lines 720 based on a voltage from word lines 735—e.g., based on the word lines 735 activating the memory cells 730. In some examples, each first digit line 720 may also be coupled with a third digit line (e.g., second digit line 575 as described with reference to FIG. 5). The third digit line may be coupled with a reference voltage 740 (e.g., reference voltage 570 as described with reference to FIG. 5). In such examples, the third digit line may be precharged to the reference voltage and the charge may be shared with first digit line 720 and an input of sense amplifier 710 as described with reference to FIGS. 5 and 6.

As described with reference to FIG. 5, each amplifier 710 may be a single transistor sense amplifier 710. In such examples, each first digit line 720 may be coupled to a gate of amplifier 710. The amplifier 710 may be configured to amplify a signal received from the first digit lines 720. In some examples, the amplifier 710 may amplify a signal of the first digit lines 720 based on the charge or voltage from the first digit line 720 and the reference voltage 740—e.g., based on charge coupled from the first digit lines 720 and a capacitor (e.g., discrete capacitor or other digit line) charged to the reference voltage 740. The amplifiers 710 may also be coupled with second digit lines 725.

Second digit lines 725 may be configured to transfer the amplified signal from the amplifier 710 to a sense component 715 (e.g., transfer a second signal). In some examples, there may be additional second digit lines 725 not illustrated. In such examples, a plurality of second digit lines 725 may each be coupled with a subset of the first digit lines 720. Accordingly, the sense architecture 701 may include logic components coupled with the subset of first digit lines 720 and each second digit line 725. Logic components may be configured to select a first digit line 720 of the subset of first digit lines 720 to couple with the second digit line 725—e.g., a logic component may couple DL_1 720 with the second digit line 725. In some examples, the second digit lines 725 may have physical characteristics different than first digit lines 720—e.g., second digit lines 725 may be longer than first digit lines 720, may have a wider pitch, or may have a lower capacitance than first digit lines 720.

Sense component 715 may be configured to latch a logic value associated with the memory cells 730 of the sub-tiles 705 based on receiving the signal from the second digit lines 725. That is, amplifiers 710 may amplify signals while sense component 715 may include an amplification stage and a latch stage—e.g., sense component 715 may amplify and latch the second signal received from the second digit lines 725. By utilizing amplifiers 710 and sense components 715, a memory array may reduce an area utilized by the sense components and have larger sub-tiles 705.

Figure 8:
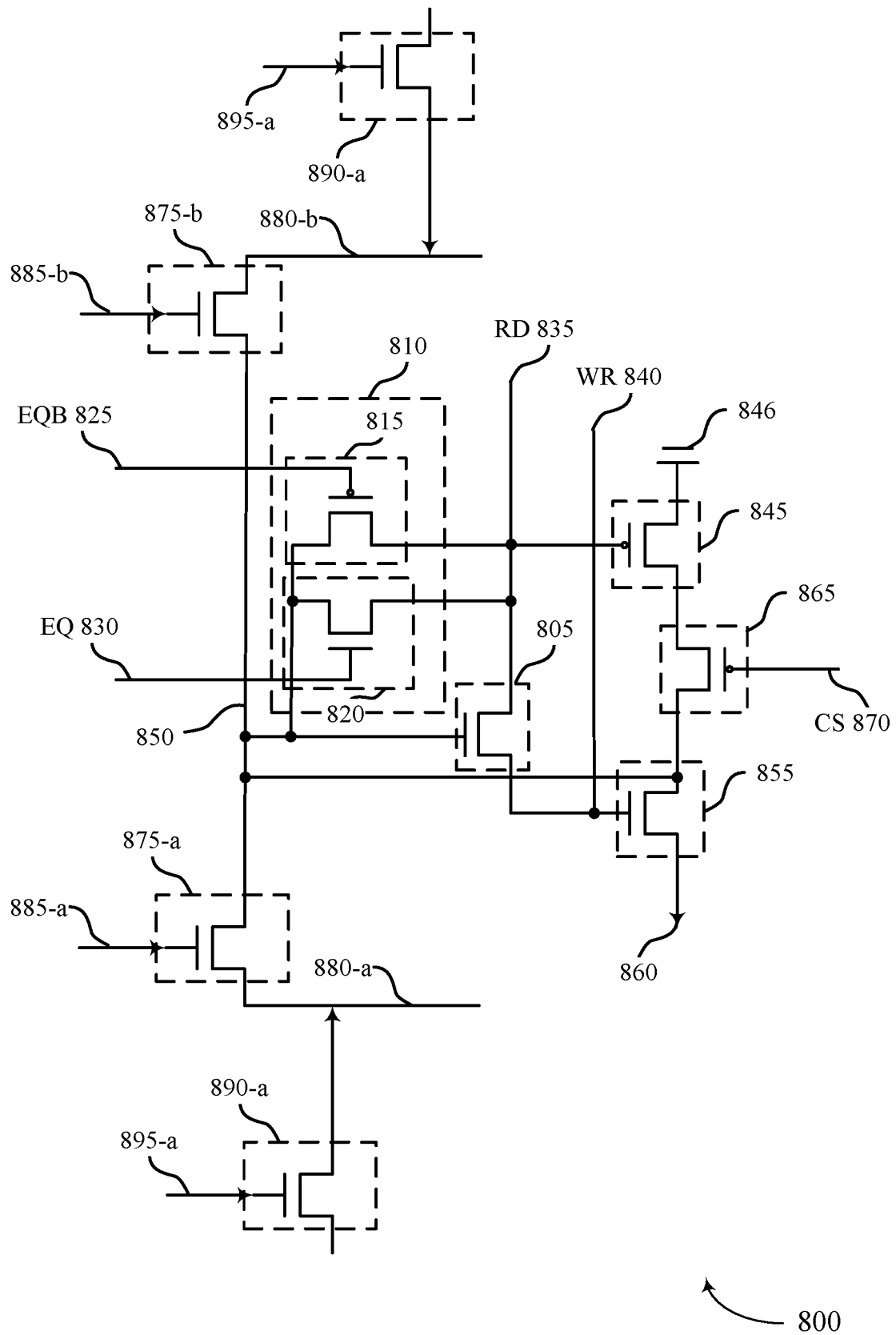
FIG. 8 illustrates an example of a sense architecture that supports sense amplifier with digit line multiplexing in accordance with examples as disclosed herein.

FIG. 8 illustrates an example of a sense architecture 800 that supports sense amplifier with digit line multiplexing in accordance with examples as disclosed herein. Sense architecture 800 may be an example sense architecture 700 and 701 as described with reference to FIGS. 7A and 7B. In some examples, sense architecture 800 may include components illustrated in the memory die of FIG. 5. For example, the sense architecture 800 may include an amplifier 805 (e.g., amplifier 545 as described with reference to FIG. 5), a switch 810 (e.g., switch 555 as described with reference to FIG. 5), and a digit line 880-*a* and digit line 880-*b* (e.g., digit line 525 and 575, respectively, as described with reference to FIG. 5). The sense architecture 800 may also include a first transistor 845, a second transistor 855, a third transistor 865, transistor pair 875, and transistor pair 895.

In some examples, the amplifier 805 may be configured to receive a charge or voltage from digit line 880-*a* and digit line 880-*b* and amplify the voltage or charge—e.g., to a second digit line as described with reference to FIGS. 7A and 7B. In such examples, the amplifier 805 may output a result of a read operation on a read signal (RD) 835. In some examples, there may be a current source (not shown) coupled with RD signal 835. In such examples, the current source may provide a current to RD signal 835 as described with reference to FIG. 9. In some examples, the digit line 880-*a* and digit line 880-*b* may represent a signal from a plurality of digit lines that are multiplexed. In such examples, transistor 875-*a* and 875-*b* may be configured to multiplex the digit lines based on receiving a signal 885-*a*. Additionally, transistor 895-*a* and transistor 85-*b* may couple the digit line 880-*a* and digit line 880-*b*, respectively, with a voltage source (not shown) based on a signal 895-*a*—e.g., to bias the digit line 880-*a* and digit 880-*b* to a predetermined voltage.

In some examples, a switch 810 may be configured to couple a gate 850 (e.g., gate 550 as described with reference to FIG. 5) of the amplifier 805 to precharge the amplifier 805 before an access operation—e.g., before a read operation. In such examples, transistor 815 may receive a signal EQB 825 and transistor 820 may receive a signal EQ 830. In some examples, transistor 815 may be a P-channel metal-oxide-semiconductor (pMOS) transistor and transistor 820 may be a N-type metal-oxide-semiconductor (nMOS) transistor. In such examples, the EQB 825 signal and EQ signal 830 may be at an opposite state when active—e.g., one signal may be high while the other is low as described with reference to FIG. 9. That is, a gate of transistor 815 may be coupled with the EQB signal 825 while a gate of transistor 820 may be coupled with 820. This may result in a same voltage at a source of transistor 815 and a drain of transistor 820, both of which are coupled to the gate of amplifier 805.

In some examples, sense architecture 800 may include a first transistor 845 that is coupled to a voltage source 846 at a source and to transistor 815 at a gate. A second transistor 855 may be coupled to a ground voltage 860 at a source and to amplifier 805 at a gate. The third transistor 865 may be coupled to a CS signal 870 at a gate and to the first transistor 845 and second transistor 855.

In some cases, sense architecture 800 may receive a signal WR 840 that may control the operation of sense architecture 800. In some examples, a state WR 840 and RD 835 may indicate whether sense architecture 800 is performing a read operation or a write operation. For example, if WR 840 is in a low state and a current is supplied to RD 835, then sense architecture 800 may be performing a read operation. In such examples, RD 835 may depend on digit line 880-*a*. For example, if the voltage on the gate 850 is below the threshold voltage of the amplifier 805, RD835 may be high, and if the voltage on the gate 850 is above the threshold voltage of the amplifier 805, RD835 may be low. In other examples, if WR 840 is in a high state and current is supplied to RD 835, the digit line 880-*a* may be pulled low based on transistor 855 and 875-*a*. In some cases, if both WR 840 and RD 835 are in the low state, the digit line 880-*a* may be pulled high via transistors 845, 865, and 875-*a*.

Figure 9:
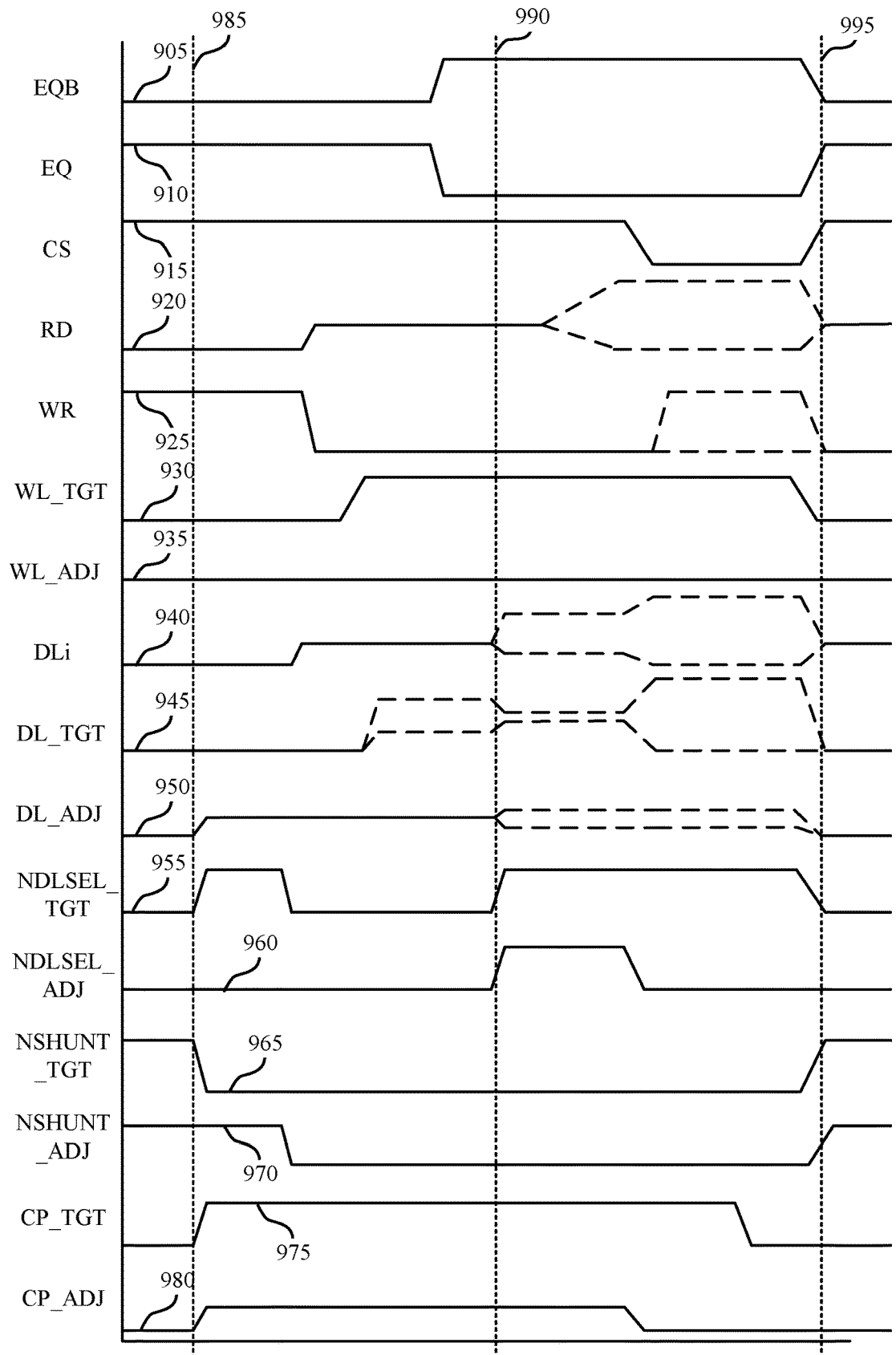
FIG. 9 illustrates an example of a timing diagram that supports sense amplifier with digit line multiplexing in accordance with examples as disclosed herein.

FIG. 9 illustrates an example of a timing diagram 900 that supports sense amplifier with digit line multiplexing in accordance with examples as disclosed herein. Timing diagram 900 includes voltages and signals of components described with reference to FIG. 5 and FIG. 8. For example, timing diagram 900 includes an EQB signal 905 (e.g., EQB signal 825), an EQ signal 910 (e.g., EQ signal 830), CS signal 915 (e.g., CS signal 870), RD signal 920 (e.g., RD signal 835), WR signal 925 (e.g., WR signal 840 as described with reference to FIG. 8), WL_TGT signal 930 (e.g., word line voltage 460 at a word line as described with reference to FIG. 4), WL_ADJ 935 (e.g., voltage at word line adjacent to a selected memory cell), DLi 940 (voltage at digit line 880), DL_TGT 945 (e.g., voltage at digit line charged by a selected memory cell), DL_ADJ 950 (e.g., voltage at second digit line 575), NDLSEL_TGT 955 (e.g., signal 540), NDLSEL_ADJ 960 (e.g., signal 590), NSHUNT_TGT 965 (e.g., switch 510), NSHUNT_ADJ 970 (e.g., switch 572), CP_TGT 975 (e.g., voltage at a plate of targeted memory cell 505), and CP_ADJ 980 (voltage at a plate of the second word line 575).

At 985, NDLSEL_TGT 955 may go high and activate transistor 535 to couple the first digit line 525 with a first node (e.g., 550) between the transistors 535 and 585. The switch 510 may be deactivated and couple the memory cell 505 with a ground voltage. Accordingly, the selected digit line (e.g., first digit line 525) may be precharged to ground. Additionally, in some examples, a CP_TGT 975 may go high and drive a voltage to a cell plate of a selected memory cell. In some examples, at 985 the switch 810 may be active and an equalization across an input stage and output stage of the amplifier 545 may occur.

The second digit line 575 may be driven to a reference voltage at a time 985 while the first digit line is driven to ground. For example, the switch 572 may be activated to couple the reference voltage to the second digit line 575. At a time between 985 and 990, the switch 572 may be deactivated (e.g., NSHUNT_ADJ may be deactivated) and the second digit line 575 may be isolated from the reference voltage. The transistor 535 may also be deactivated after the first digit line 525 is precharged to ground (e.g., NDLSEL_TGT may be driven low). A current on DLi 940 may be applied until a threshold voltage of DLi 940 is achieved between time 985 and 990.

In some examples, a current may be sourced to RD signal 920 (e.g., RD 835) and along with EQ 910 being high, may cause the RD signal 920 to increase until a threshold voltage is satisfied. In some cases, WR signal 925 may be driven low. In some examples, a word line may be selected based on WL_TGT 930 going high after the RD signal 920 satisfies the threshold voltage. In some examples, based on the word line being selected, the memory cell may share charge with the first digit line 525 and a charge may be present on DL_TGT 945 depending on a logic state of the memory cell—e.g., a first logic state may result in a first charge at DL_TGT 945 and a second logic state may result in a second charge at DL_TGT 945, the first charge greater than the second charge After the memory cell transfers charge to the first digit line 525, the switch 810 may be deactivated and the amplifier 550 input may be isolated from the output.

At 990, NDSEL_TGT 955 and NDSEL_ADJ 960 may both go high to couple first digit line 525 and second digit line 575 to the input of amplifier 545—e.g., to activate transistors 535 and 585. In such examples, coupling first digit line 525 and second digit line 575 may cause a voltage on DLi 940, DL_TGT 945, and DL_ADJ 950 to change based on a logic state of the memory cell. Amplifier 545 may output a RD signal 920 at the drain of amplifier 545 to amplify the charge received from first digit line 525 and second digit line 575. For example, if the charge received from first digit line 525 and second digit line 575 is greater than a threshold voltage of amplifier 545, RD signal 920 may decrease as the output is pulled down by the amplifier 545. In other examples, if the charge received from first digit line 525 is less than a threshold voltage of amplifier 545, RD signal 920 may increase as a current from a current source charges up the RD signal 920.

Subsequent to coupling first digit line 525 and second digit line 575 to the input of the amplifier 545, WR 925 may be driven based on a logic state stored at latch 595. A CS signal 915 may also go high at a gate of a third transistor 865. Having the CS signal 915 driven high may cause a greater increase and improve the read margin on the DLi 940 and DL_TGT 945—e.g., a difference between a voltage associated with a first logic state and a voltage associated with a second logic state may increase based on CS 915 high. While the WR 925 is driven by the logic state, the NDLSEL_ADJ may go low and cause transistor 875 to be deactivated and isolate the input of the sense amplifier from the second digit line 575. After driving CS 915 high, a logic state of the memory cell may be sensed and latched at latch 595. Accordingly, CP_TGT 975 may go low and a voltage at the cell plate may be terminated.

At 995, the gain transistor 810 may be activated to equalize the input and output of the amplifier 545. The CS signal 915 and WR 925 may both be driven low. Based on sensing the logic state of the memory cell, NDLSEL_TGT may go low and deactivate transistor 535 to isolate the first digit line 525 from the input of the amplifier 545. The WL_TGT may go low to turn off the selected word line. In some examples, NSHUNT_TGT may go high to activate switch 510 to couple voltage source 515 with the memory cell 505. In some cases, NSHUNT_ADJ may go high to activate switch 572 to couple the reference voltage with the second digit line 575. By utilizing the read techniques as described herein, the memory array may increase a read margin and decrease amount of size utilized by the sense amplifiers and sense components in the memory array.

Figure 10:
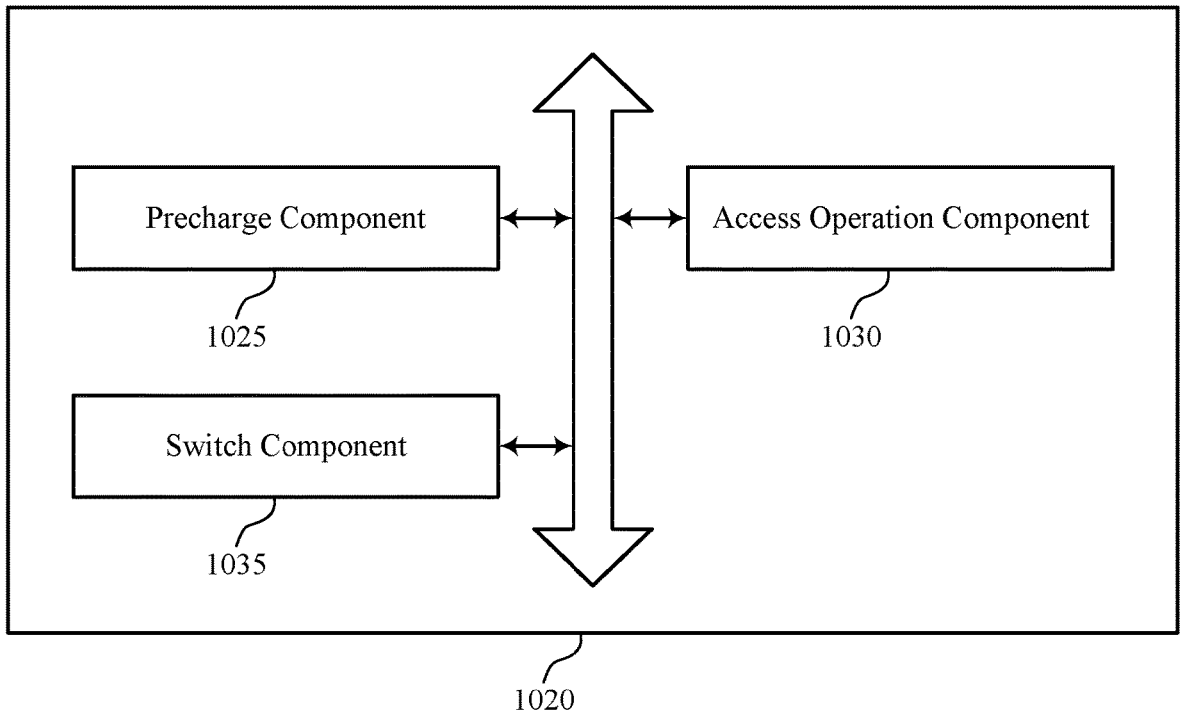
FIG. 10 shows a block diagram of a memory device that supports sense amplifier with digit line multiplexing in accordance with examples as disclosed herein.

FIG. 10 shows a block diagram 1000 of a memory device 1020 that supports sense amplifier with digit line multiplexing in accordance with examples as disclosed herein. The memory device 1020 may be an example of aspects of a memory device as described with reference to FIGS. 1 through 9. The memory device 1020, or various components thereof, may be an example of means for performing various aspects of sense amplifier with digit line multiplexing as described herein. For example, the memory device 1020 may include a precharge component 1025, an access operation component 1030, a switch component 1035, or any combination thereof. Each of these components may communicate, directly or indirectly, with one another (e.g., via one or more buses).

The precharge component 1025 may be configured as or otherwise support a means for precharging an input and an output of an amplifier stage of a sense component to a first voltage based at least in part on a read operation associated with a memory cell. In some examples, the precharge component 1025 may be configured as or otherwise support a means for precharging a first side and a second side of a latch stage of the sense component to the first voltage based at least in part on precharging the output of the amplifier stage to the first voltage, where the latch stage is coupled with the amplifier stage.

The access operation component 1030 may be configured as or otherwise support a means for coupling a second voltage from a digit line associated with the memory cell to the input of the amplifier stage, where the amplifier stage generates a third voltage on the output based at least in part on coupling the second voltage to the input, and where the latch stage latches a logic value associated with the memory cell based at least in part on the third voltage. In some cases, the access operation component 1030 may be configured as or otherwise support a means for coupling a second input of the amplifier stage with a reference voltage based at least in part on coupling the second voltage from the digit line to the input of the amplifier stage. In some instances, the access operation component 1030 may be configured as or otherwise support a means for transferring charge from a reference voltage to the digit line, where coupling the second voltage from the digit line is based at least in part on transferring charge from the reference voltage to the digit line.

In some examples, to support precharging the input and the output of the amplifier stage, the switch component 1035 may be configured as or otherwise support a means for activating a switch coupled with the input and the output of the amplifier stage to couple the input of the amplifier stage with the output of the amplifier stage. In some cases, to support precharging the first side and the second side of the latch stage, the switch component 1035 may be configured as or otherwise support a means for activating a second switch coupled with the output of the amplifier stage and the first side to couple the output of the amplifier stage with the first side of the latch stage. In some examples, to support precharging the first side and the second side of the latch stage, the switch component 1035 may be configured as or otherwise support a means for activating a third switch coupled with the second side and the input of the amplifier stage to couple the input of the amplifier stage with the second side of the latch stage. In some instances, to support coupling the second voltage from the digit line to the input of the amplifier stage, the switch component 1035 may be configured as or otherwise support a means for deactivating a switch coupled with the input of the amplifier stage and a precharge voltage. In some examples, to support coupling the second voltage from the digit line to the input of the amplifier stage, the switch component 1035 may be configured as or otherwise support a means for activating a second switch coupled with the digit line and the input of the amplifier stage.

In some cases, to support coupling the second voltage from the digit line to the input of the amplifier stage, the switch component 1035 may be configured as or otherwise support a means for deactivating a switch coupled with the input of the amplifier stage and a precharge voltage. In some examples, to support coupling the second voltage from the digit line to the input of the amplifier stage, the switch component 1035 may be configured as or otherwise support a means for activating a second switch coupled with the digit line and the input of the amplifier stage.

Figure 11:
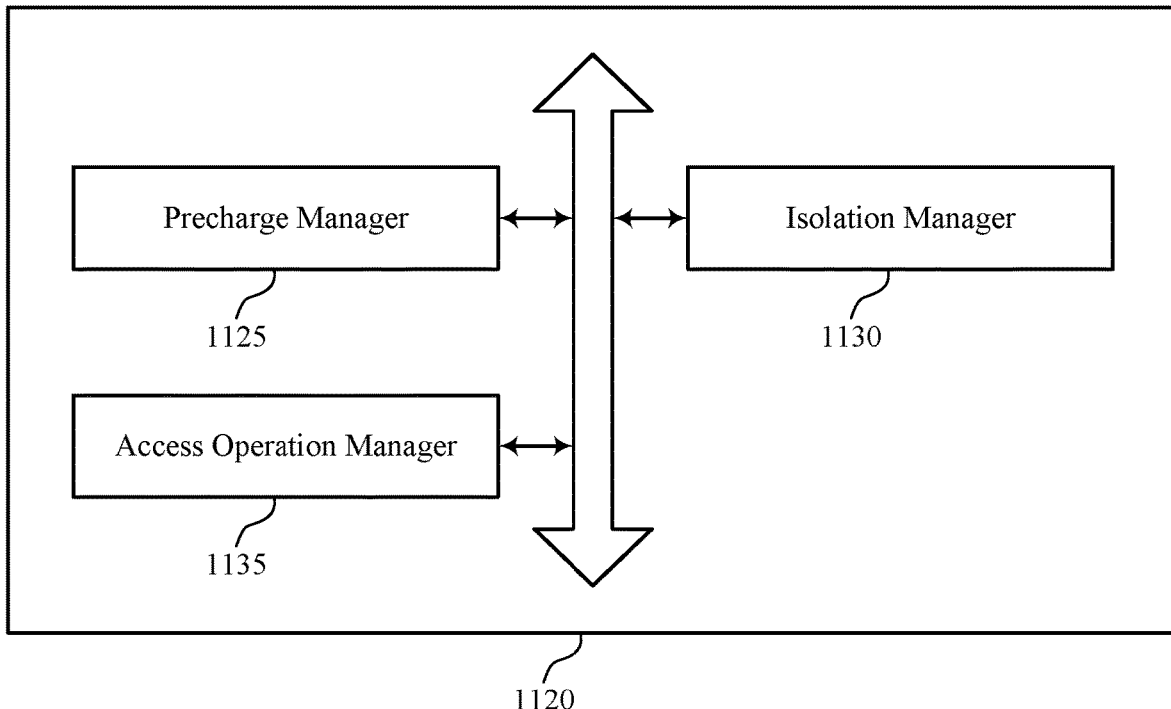
FIG. 11 shows a block diagram of a memory device that supports sense amplifier with digit line multiplexing in accordance with examples as disclosed herein.

FIG. 11 shows a block diagram 1100 of a memory device 1120 that supports sense amplifier with digit line multiplexing in accordance with examples as disclosed herein. The memory device 1120 may be an example of aspects of a memory device as described with reference to FIGS. 1 through 9. The memory device 1120, or various components thereof, may be an example of means for performing various aspects of sense amplifier with digit line multiplexing as described herein. For example, the memory device 1120 may include a precharge manager 1125, an isolation manager 1130, an access operation manager 1135, or any combination thereof. Each of these components may communicate, directly or indirectly, with one another (e.g., via one or more buses).

The precharge manager 1125 may be configured as or otherwise support a means for precharging an input of a sense amplifier to a first voltage associated with a first reference voltage of the sense amplifier. In some examples, the precharge manager 1125 may be configured as or otherwise support a means for precharging a second digit line to a second reference voltage. In some examples, to support precharging the input of the sense amplifier to the first voltage, the precharge manager 1125 may be configured as or otherwise support a means for activating a switch to couple a gate of the sense amplifier with the output of the sense amplifier. In some examples, to support coupling the memory cell with the first digit line, the precharge manager 1125 may be configured as or otherwise support a means for activating a switch to couple a plate of the memory cell with a second voltage source, where the first charge of the digit line is based at least in part on activating the switch and transferring a third charge from the memory cell to the digit line. In some examples, the second digit line is a dummy bit line and precharging the second digit line to the second reference voltage by the precharge manager 1125 is based at least in part on a capacitance of the dummy bit line.

The isolation manager 1130 may be configured as or otherwise support a means for isolating the input of the sense amplifier based at least in part on precharging the input of the sense amplifier. In some examples, to support isolating the input of the sense amplifier, the isolation manager 1130 may be configured as or otherwise support a means for deactivating a switch to isolate a gate of the sense amplifier from the output of the sense amplifier.

The access operation manager 1135 may be configured as or otherwise support a means for coupling a memory cell of a memory array associated with an access operation with a first digit line. In some examples, the access operation manager 1135 may be configured as or otherwise support a means for coupling, subsequent to coupling the memory cell with the first digit line, the first digit line to the input of the sense amplifier to transfer a first charge from the first digit line to the input of the sense amplifier. In some examples, the access operation manager 1135 may be configured as or otherwise support a means for coupling, subsequent to precharging the second digit line, the second digit line to the input of the sense amplifier to transfer a second charge from the second digit line to the input of the sense amplifier, where an output of the sense amplifier is based at least in part on a change in voltage of the input of the sense amplifier due to transfer of the first charge and the second charge to the input of the sense amplifier. In some examples, to support coupling the first digit line to the input of the sense amplifier, the access operation manager 1135 may be configured as or otherwise support a means for activating a transistor coupled with the first digit line and a node, the node coupled with the input of the sense amplifier. In some examples, coupling the second digit line to the input of the sense amplifier by the access operation manager 1135 further includes activating a second transistor coupled with the second digit line and the node.

In some examples, a gain stage for the sense amplifier includes a single transistor and the first reference voltage of the sense amplifier is a threshold voltage of the single transistor.

Figure 12:
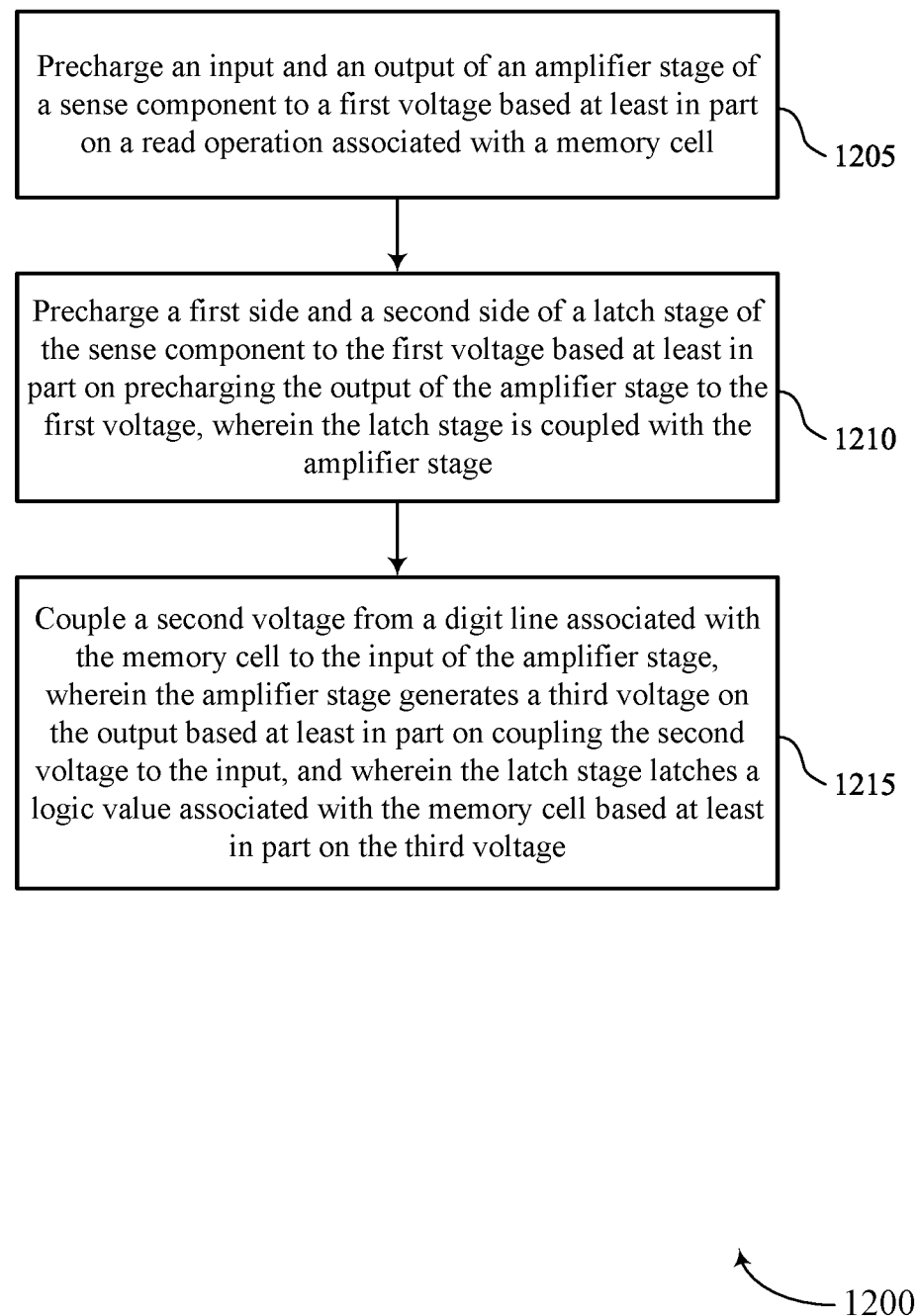
FIGS. 12 and 13 show flowcharts illustrating a method or methods that support sense amplifier with digit line multiplexing in accordance with examples as disclosed herein.

FIG. 12 shows a flowchart illustrating a method 1200 that supports sense amplifier with digit line multiplexing in accordance with examples as disclosed herein. The operations of method 1200 may be implemented by a memory device or its components as described herein. For example, the operations of method 1200 may be performed by a memory device as described with reference to FIGS. 1 through 10. In some examples, a memory device may execute a set of instructions to control the functional elements of the device to perform the described functions. Additionally or alternatively, the memory device may perform aspects of the described functions using special-purpose hardware.

At 1205, the method may include precharging an input and an output of an amplifier stage of a sense component to a first voltage based at least in part on a read operation associated with a memory cell. The operations of 1205 may be performed in accordance with examples as disclosed herein. In some examples, aspects of the operations of 1205 may be performed by a precharge component 1025 as described with reference to FIG. 10.

At 1210, the method may include precharging a first side and a second side of a latch stage of the sense component to the first voltage based at least in part on precharging the output of the amplifier stage to the first voltage, where the latch stage is coupled with the amplifier stage. The operations of 1210 may be performed in accordance with examples as disclosed herein. In some examples, aspects of the operations of 1210 may be performed by a precharge component 1025 as described with reference to FIG. 10.

At 1215, the method may include coupling a second voltage from a digit line associated with the memory cell to the input of the amplifier stage, where the amplifier stage generates a third voltage on the output based at least in part on coupling the second voltage to the input, and where the latch stage latches a logic value associated with the memory cell based at least in part on the third voltage. The operations of 1215 may be performed in accordance with examples as disclosed herein. In some examples, aspects of the operations of 1215 may be performed by an access operation component 1030 as described with reference to FIG. 10.

In some examples, an apparatus as described herein may perform a method or methods, such as the method 1200. The apparatus may include, features, circuitry, logic, means, or instructions (e.g., a non-transitory computer-readable medium storing instructions executable by a processor) for precharging an input and an output of an amplifier stage of a sense component to a first voltage based at least in part on a read operation associated with a memory cell, precharging a first side and a second side of a latch stage of the sense component to the first voltage based at least in part on precharging the output of the amplifier stage to the first voltage, where the latch stage is coupled with the amplifier stage, and coupling a second voltage from a digit line associated with the memory cell to the input of the amplifier stage, where the amplifier stage generates a third voltage on the output based at least in part on coupling the second voltage to the input, and where the latch stage latches a logic value associated with the memory cell based at least in part on the third voltage.

In some cases of the method 1200 and the apparatus described herein, precharging the input and the output of the amplifier stage may include operations, features, circuitry, logic, means, or instructions for activating a switch coupled with the input and the output of the amplifier stage to couple the input of the amplifier stage with the output of the amplifier stage.

In some instances of the method 1200 and the apparatus described herein, precharging the first side and the second side of the latch stage may include operations, features, circuitry, logic, means, or instructions for activating a second switch coupled with the output of the amplifier stage and the first side to couple the output of the amplifier stage with the first side of the latch stage and activating a third switch coupled with the second side and the input of the amplifier stage to couple the input of the amplifier stage with the second side of the latch stage.

In some examples of the method 1200 and the apparatus described herein, coupling the second voltage from the digit line to the input of the amplifier stage may include operations, features, circuitry, logic, means, or instructions for deactivating a switch coupled with the input of the amplifier stage and a precharge voltage and activating a second switch coupled with the digit line and the input of the amplifier stage.

Some cases of the method 1200 and the apparatus described herein may further include operations, features, circuitry, logic, means, or instructions for coupling a second input of the amplifier stage with a reference voltage based at least in part on coupling the second voltage from the digit line to the input of the amplifier stage.

In some instances of the method 1200 and the apparatus described herein, coupling the second voltage from the digit line to the input of the amplifier stage may include operations, features, circuitry, logic, means, or instructions for deactivating a switch coupled with the input of the amplifier stage and a precharge voltage and activating a second switch coupled with the digit line and the input of the amplifier stage.

Some examples of the method 1200 and the apparatus described herein may further include operations, features, circuitry, logic, means, or instructions for transferring charge from a reference voltage to the digit line, where coupling the second voltage from the digit line may be based at least in part on transferring charge from the reference voltage to the digit line.

Figure 13:
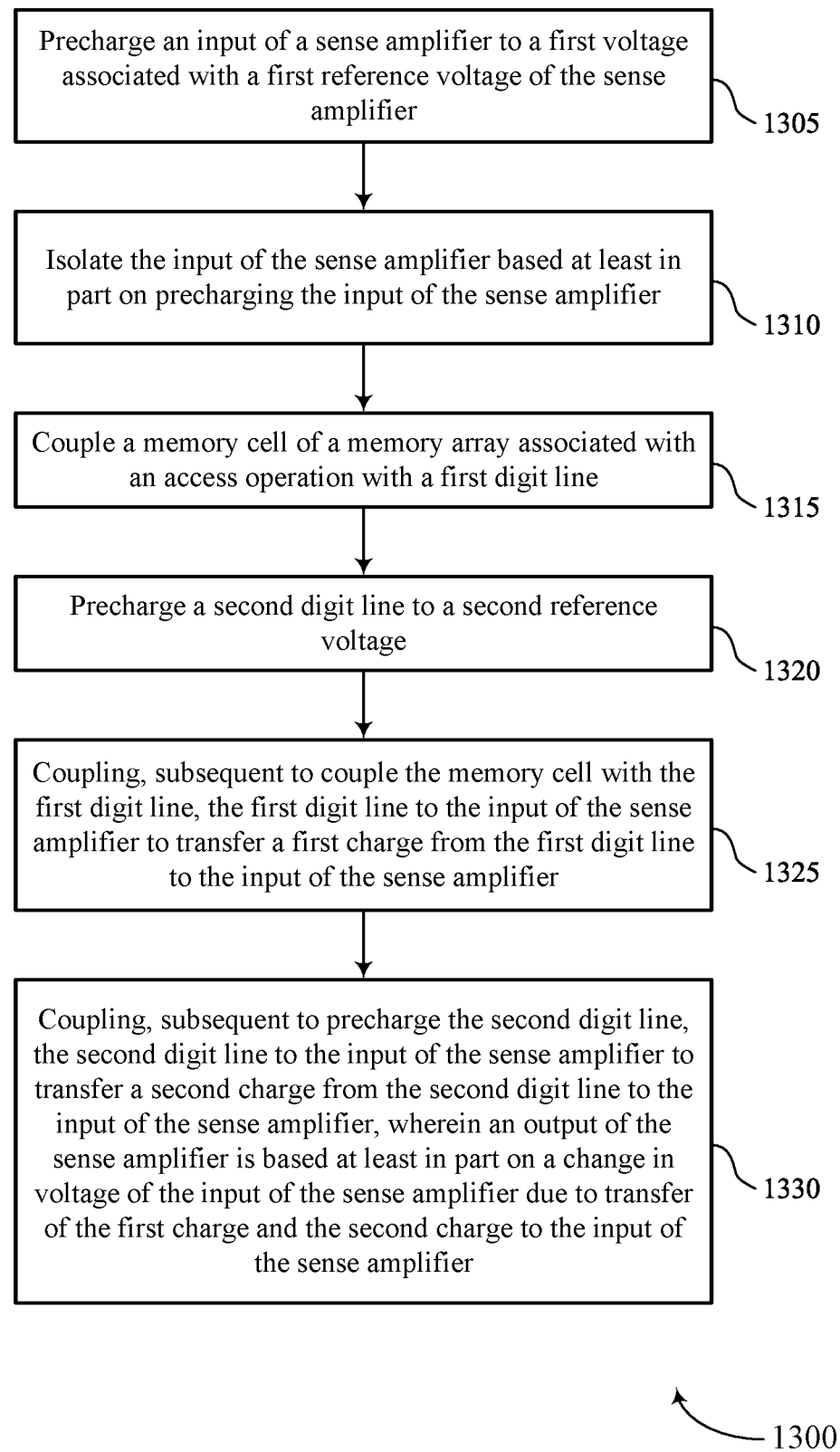

FIG. 13 shows a flowchart illustrating a method 1300 that supports sense amplifier with digit line multiplexing in accordance with examples as disclosed herein. The operations of method 1300 may be implemented by a memory device or its components as described herein. For example, the operations of method 1300 may be performed by a memory device as described with reference to FIGS. 1 through 9 and 11. In some examples, a memory device may execute a set of instructions to control the functional elements of the device to perform the described functions. Additionally or alternatively, the memory device may perform aspects of the described functions using special-purpose hardware.

At 1305, the method may include precharging an input of a sense amplifier to a first voltage associated with a first reference voltage of the sense amplifier. The operations of 1305 may be performed in accordance with examples as disclosed herein. In some examples, aspects of the operations of 1305 may be performed by a precharge manager 1125 as described with reference to FIG. 11.

At 1310, the method may include isolating the input of the sense amplifier based at least in part on precharging the input of the sense amplifier. The operations of 1310 may be performed in accordance with examples as disclosed herein. In some examples, aspects of the operations of 1310 may be performed by an isolation manager 1130 as described with reference to FIG. 11.

At 1315, the method may include coupling a memory cell of a memory array associated with an access operation with a first digit line. The operations of 1315 may be performed in accordance with examples as disclosed herein. In some examples, aspects of the operations of 1315 may be performed by an access operation manager 1135 as described with reference to FIG. 11.

At 1320, the method may include precharging a second digit line to a second reference voltage. The operations of 1320 may be performed in accordance with examples as disclosed herein. In some examples, aspects of the operations of 1320 may be performed by a precharge manager 1125 as described with reference to FIG. 11.

At 1325, the method may include coupling, subsequent to coupling the memory cell with the first digit line, the first digit line to the input of the sense amplifier to transfer a first charge from the first digit line to the input of the sense amplifier. The operations of 1325 may be performed in accordance with examples as disclosed herein. In some examples, aspects of the operations of 1325 may be performed by an access operation manager 1135 as described with reference to FIG. 11.

At 1330, the method may include coupling, subsequent to precharging the second digit line, the second digit line to the input of the sense amplifier to transfer a second charge from the second digit line to the input of the sense amplifier, where an output of the sense amplifier is based at least in part on a change in voltage of the input of the sense amplifier due to transfer of the first charge and the second charge to the input of the sense amplifier. The operations of 1330 may be performed in accordance with examples as disclosed herein. In some examples, aspects of the operations of 1330 may be performed by an access operation manager 1135 as described with reference to FIG. 11.

In some examples, an apparatus as described herein may perform a method or methods, such as the method 1300. The apparatus may include, features, circuitry, logic, means, or instructions (e.g., a non-transitory computer-readable medium storing instructions executable by a processor) for precharging an input of a sense amplifier to a first voltage associated with a first reference voltage of the sense amplifier, isolating the input of the sense amplifier based at least in part on precharging the input of the sense amplifier, coupling a memory cell of a memory array associated with an access operation with a first digit line, precharging a second digit line to a second reference voltage, coupling, subsequent to coupling the memory cell with the first digit line, the first digit line to the input of the sense amplifier to transfer a first charge from the first digit line to the input of the sense amplifier, and coupling, subsequent to precharging the second digit line, the second digit line to the input of the sense amplifier to transfer a second charge from the second digit line to the input of the sense amplifier, where an output of the sense amplifier is based at least in part on a change in voltage of the input of the sense amplifier due to transfer of the first charge and the second charge to the input of the sense amplifier.

In some instances of the method 1300 and the apparatus described herein, precharging the input of the sense amplifier to the first voltage may include operations, features, circuitry, logic, means, or instructions for activating a switch to couple a gate of the sense amplifier with the output of the sense amplifier.

In some cases of the method 1300 and the apparatus described herein, a gain stage for the sense amplifier includes a single transistor and the first reference voltage of the sense amplifier may be a threshold voltage of the single transistor.

In some examples of the method 1300 and the apparatus described herein, isolating the input of the sense amplifier may include operations, features, circuitry, logic, means, or instructions for deactivating a switch to isolate a gate of the sense amplifier from the output of the sense amplifier.

In some instances of the method 1300 and the apparatus described herein, coupling the memory cell with the first digit line may include operations, features, circuitry, logic, means, or instructions for activating a switch to couple a plate of the memory cell with a second voltage source, where the first charge of the digit line may be based at least in part on activating the switch and transferring a third charge from the memory cell to the digit line.

In some cases of the method 1300 and the apparatus described herein, the second digit line may be a dummy bit line and precharging the second digit line to the second reference voltage may be based at least in part on a capacitance of the dummy bit line.

In some examples of the method 1300 and the apparatus described herein, coupling the first digit line to the input of the sense amplifier may include operations, features, circuitry, logic, means, or instructions for activating a transistor coupled with the first digit line and a node, the node coupled with the input of the sense amplifier.

Some instances of the method 1300 and the apparatus described herein may further include operations, features, circuitry, logic, means, or instructions for coupling the second digit line to the input of the sense amplifier further includes activating a second transistor coupled with the second digit line and the node.

It should be noted that the methods described herein are possible implementations, and that the operations and the steps may be rearranged or otherwise modified and that other implementations are possible. Furthermore, portions from two or more of the methods may be combined.

Another apparatus is described. The apparatus may include a memory array including, a plurality of sub-tiles each including, a plurality of first digit lines each coupled with one or more memory cells within the each sub-tile of the plurality of sub-tiles, a plurality of amplifiers coupled with respective first digit lines of the plurality of first digit lines and configured to amplify respective first signals of the respective first digit lines, a plurality of second digit lines each coupled with a subset of the plurality of first digit lines associated with a respective subset of the plurality of sub-tiles, and a plurality of sense components coupled with the plurality of second digit lines and configured to latch logic values associated with memory cells of one or more of the plurality of sub-tiles based at least in part on respective second signals received from the plurality of second digit lines.

In some cases of the apparatus, the plurality of amplifiers each include a single transistor amplifier and a gate of each amplifier of the plurality of amplifiers may be coupled with each first digit line of the plurality of digit lines.

In some instances, the apparatus may include a reference voltage source coupled with each first digit line and configured to precharge each first digit line to a first voltage, where the plurality of amplifiers may be configured to amplify the respective first signals of the respective digit line based on the first voltage and a second voltage of the one or more memory cells within each sub-tile.

In some cases, the apparatus may include a plurality of logic components coupled with each subset of the plurality of first digit lines and each second digit line of the plurality of second digit lines and configured to select a digit line of the subset of the plurality of first digit lines to couple with a second digit line of the plurality of second digit lines.

In some instances of the apparatus, the second digit line of the plurality of second digit lines may be configured to receive the amplified respective first signal from the digit line of the subset of the plurality of first digit lines and transmit the respective first signal to a sense component of the plurality of sense components.

Another apparatus is described. The apparatus may include a memory array including a memory cell, a first digit line coupled with the memory cell, a sense amplifier including an input and an output, a second digit line coupled with the input of the sense amplifier, and a controller coupled with the memory array and configured to cause the apparatus to precharge the input of the sense amplifier to a first voltage associated with a first reference voltage of the sense amplifier, isolate the input of the sense amplifier based at least in part on precharging the input of the sense amplifier, couple the memory cell of the memory array associated with an access operation with the first digit line, precharge the second digit line to a second reference voltage, couple, subsequent to coupling the memory cell with the first digit line, the first digit line to the input of the sense amplifier to transfer a first charge from the first digit line to the input of the sense amplifier, and couple, subsequent to precharging the second digit line, the second digit line to the input of the sense amplifier to transfer a second charge from the second digit line to the input of the sense amplifier, where the output of the sense amplifier is based at least in part on a change in voltage of the input of the sense amplifier due to transfer of the first charge and the second charge to the input of the sense amplifier.

In some examples, the controller may be further configured to cause the apparatus to activate a switch to couple a gate of the sense amplifier with the output of the sense amplifier.

In some cases of the apparatus, a gain stage for the sense amplifier includes a single transistor and the first reference voltage of the sense amplifier may be a threshold voltage of the single transistor.

In some instances, the controller may be further configured to cause the apparatus to deactivate a switch to isolate a gate of the sense amplifier from the output of the sense amplifier.

In some examples of the apparatus, the second digit line may be a dummy bit line and the controller may be configured to precharge the second digit line based at least in part on a capacitance of the second digit line.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   precharging an input and an output of an amplifier stage of a sense component to a first voltage based at least in part on a read operation associated with a memory cell;
   activating a switch coupled with the output of the amplifier stage and a first side of a latch stage of the sense component to couple the output of the amplifier stage with the first side of the latch stage;
   deactivating a second switch coupled with a second side of the latch stage and the input of the amplifier stage;
   precharging at least one side of the latch stage to the first voltage based at least in part on activating the switch, deactivating the second switch, and precharging the output of the amplifier stage to the first voltage, wherein the latch stage is coupled with the amplifier stage; and
   coupling a second voltage from a digit line associated with the memory cell to the input of the amplifier stage, wherein the amplifier stage generates a third voltage on the output based at least in part on coupling the second voltage to the input, and wherein the latch stage latches a logic value associated with the memory cell based at least in part on the third voltage.

2. The method of claim 1, wherein precharging the input and the output of the amplifier stage further comprises:
   activating a third switch coupled with the input and the output of the amplifier stage to couple the input of the amplifier stage with the output of the amplifier stage.

3. The method of claim 1, wherein the amplifier stage comprises a differential amplifier, and wherein coupling the second voltage from the digit line to the input of the amplifier stage further comprises:
   deactivating a third switch coupled with the input of the amplifier stage and a precharge voltage; and
   activating a fourth switch coupled with the digit line and the input of the amplifier stage.

4. The method of claim 3, further comprising:
   coupling a second input of the amplifier stage with a reference voltage based at least in part on coupling the second voltage from the digit line to the input of the amplifier stage.

5. The method of claim 1, wherein the amplifier stage comprises a single transistor amplifier, and wherein coupling the second voltage from the digit line to the input of the amplifier stage further comprises:
   deactivating a third switch coupled with the input of the amplifier stage and a precharge voltage; and
   activating a fourth switch coupled with the digit line and the input of the amplifier stage.

6. The method of claim 5, further comprising:
   transferring charge from a reference voltage to the digit line, wherein coupling the second voltage from the digit line is based at least in part on transferring the charge from the reference voltage to the digit line.

7. A method, comprising:
   precharging an input of a sense amplifier to a first voltage associated with a first reference voltage of the sense amplifier, wherein a gain stage for the sense amplifier comprises a single transistor and the first reference voltage of the sense amplifier is a threshold voltage of the single transistor;
   isolating the input of the sense amplifier based at least in part on precharging the input of the sense amplifier;

coupling a memory cell of a memory array associated with an access operation with a first digit line;
precharging a second digit line to a second reference voltage;
coupling, subsequent to coupling the memory cell with the first digit line, the first digit line to the input of the sense amplifier to transfer a first charge from the first digit line to the input of the sense amplifier; and
coupling, subsequent to precharging the second digit line, the second digit line to the input of the sense amplifier to transfer a second charge from the second digit line to the input of the sense amplifier, wherein an output of the sense amplifier is based at least in part on a change in voltage of the input of the sense amplifier due to transfer of the first charge and the second charge to the input of the sense amplifier.

8. The method of claim 7, wherein precharging the input of the sense amplifier to the first voltage further comprises:
activating a switch to couple a gate of the sense amplifier with the output of the sense amplifier.

9. The method of claim 7, wherein isolating the input of the sense amplifier further comprises:
deactivating a switch to isolate a gate of the sense amplifier from the output of the sense amplifier.

10. The method of claim 7, wherein the second digit line is a dummy bit line and precharging the second digit line to the second reference voltage is based at least in part on a capacitance of the dummy bit line.

11. The method of claim 7, wherein coupling the first digit line to the input of the sense amplifier further comprises:
activating a transistor coupled with the first digit line and a node, the node coupled with the input of the sense amplifier.

12. A method, comprising:
precharging an input of a sense amplifier to a first voltage associated with a first reference voltage of the sense amplifier;
isolating the input of the sense amplifier based at least in part on precharging the input of the sense amplifier;
activating a switch to couple a plate of a memory cell of a memory array associated with an access operation with a voltage source;
coupling the memory cell with a first digit line wherein a first charge of the first digit line is based at least in part on activating the switch and transferring a second charge from the memory cell to the first digit line;
precharging a second digit line to a second reference voltage;
coupling, subsequent to coupling the memory cell with the first digit line, the first digit line to the input of the sense amplifier to transfer the first charge from the first digit line to the input of the sense amplifier; and
coupling, subsequent to precharging the second digit line, the second digit line to the input of the sense amplifier to transfer a third charge from the second digit line to the input of the sense amplifier, wherein an output of the sense amplifier is based at least in part on a change in voltage of the input of the sense amplifier due to transfer of the first charge and the second charge to the input of the sense amplifier.

13. A method, comprising:
precharging an input of a sense amplifier to a first voltage associated with a first reference voltage of the sense amplifier;
isolating the input of the sense amplifier based at least in part on precharging the input of the sense amplifier;

coupling a memory cell of a memory array associated with an access operation with a first digit line;
precharging a second digit line to a second reference voltage;
activating a transistor coupled with the first digit line and a node, the node coupled with the input of the sense amplifier;
coupling, subsequent to coupling the memory cell with the first digit line, the first digit line to the input of the sense amplifier to transfer a first charge from the first digit line to the input of the sense amplifier;
activating a second transistor coupled with the second digit line and the node; and
coupling, subsequent to precharging the second digit line and based at least in part on activating the second transistor, the second digit line to the input of the sense amplifier to transfer a second charge from the second digit line to the input of the sense amplifier, wherein an output of the sense amplifier is based at least in part on a change in voltage of the input of the sense amplifier due to transfer of the first charge and the second charge to the input of the sense amplifier.

14. A memory device, comprising:
a memory array;
a sense component comprising an amplifier stage and a latch stage; and
one or more controllers coupled with the memory array and configured to cause the memory device to:
precharge an input and an output of the amplifier stage of the sense component to a first voltage based at least in part on a read operation associated with a memory cell of the memory array;
activate a switch coupled with the output of the amplifier stage and a first side of the latch stage of the sense component to couple the output of the amplifier stage with the first side of the latch stage;
deactivate a second switch coupled with a second side of the latch stage and the input of the amplifier stage;
precharge at least one side of the latch stage to the first voltage based at least in part on activating the switch, deactivating the second switch, and precharging the output of the amplifier stage to the first voltage, wherein the latch stage is coupled with the amplifier stage; and
couple a second voltage from a digit line associated with the memory cell to the input of the amplifier stage, wherein the amplifier stage generates a third voltage on the output based at least in part on coupling the second voltage to the input, and wherein the latch stage latches a logic value associated with the memory cell based at least in part on the third voltage.

15. The memory device of claim 14, wherein, to precharge the input and the output of the amplifier stage, the one or more controllers are configured to cause the memory device to:
activate a third switch coupled with the input and the output of the amplifier stage to couple the input of the amplifier stage with the output of the amplifier stage.

16. The memory device of claim 14, wherein the amplifier stage comprises a differential amplifier, and wherein, to couple the second voltage from the digit line to the input of the amplifier stage, the one or more controllers are configured to cause the memory device to:
deactivate a third switch coupled with the input of the amplifier stage and a precharge voltage; and activate a fourth switch coupled with the digit line and the input of the amplifier stage.

17. The memory device of claim 14, wherein the amplifier stage comprises a single transistor amplifier, and wherein, to couple the second voltage from the digit line to the input of the amplifier stage, the one or more controllers are configured to cause the memory device to:
deactivate a third switch coupled with the input of the amplifier stage and a precharge voltage; and
activate a fourth switch coupled with the digit line and the input of the amplifier stage.

\* \* \* \* \*